US00RE50807E

(19) United States
(12) Reissued Patent
Boysel

(10) Patent Number: US RE50,807 E
(45) Date of Reissued Patent: Feb. 24, 2026

(54) 3D MEMS DEVICE WITH HERMETIC CAVITY

(71) Applicant: Motion Engine Inc., Montreal (CA)

(72) Inventor: Robert Mark Boysel, Honeoye Falls, NY (US)

(73) Assignee: Motion Engine Inc., Montreal (CA)

(21) Appl. No.: 17/470,912

(22) Filed: Sep. 9, 2021

Related U.S. Patent Documents

Reissue of:
(64) Patent No.: 10,407,299
Issued: Sep. 10, 2019
Appl. No.: 15/543,700
PCT Filed: Jan. 14, 2016
PCT No.: PCT/CA2016/050031
§ 371 (c)(1),
(2) Date: Jul. 14, 2017
PCT Pub. No.: WO2016/112463
PCT Pub. Date: Jul. 21, 2016

U.S. Applications:
(60) Provisional application No. 62/138,161, filed on Mar. 25, 2015, provisional application No. 62/103,825, filed on Jan. 15, 2015.

(51) Int. Cl.
*G01C 21/16* (2006.01)
*B81B 7/00* (2006.01)
(Continued)

(52) U.S. Cl.
CPC ..... *G01C 21/166* (2020.08); *B81B 7/007* (2013.01); *B81C 1/00301* (2013.01);
(Continued)

(58) Field of Classification Search
CPC .... G01P 1/023; G01P 15/0802; G01P 15/125; G01P 15/18; G01C 19/5719;
(Continued)

(56) References Cited

U.S. PATENT DOCUMENTS 4,430,895 A 2/1984 Colton
4,483,194 A 11/1984 Rudolf
(Continued)

FOREIGN PATENT DOCUMENTS

CN 103350983 A 10/2013
EP 1802952 A1 7/2007
(Continued)

OTHER PUBLICATIONS

Chan et al., A Monolithically Integrated Pressure/Oxygen/Temperature Sensing SoC for Multimodality Intracranial Neuromonitoring. IEEE Journal of Solid-State Circuits. Nov. 2014;49(11):2449-61.

(Continued)

*Primary Examiner* — Minh Nguyen
(74) *Attorney, Agent, or Firm* — McCarter & English, LLP

(57) ABSTRACT

A three dimensional (3D) micro-electro-mechanical system (MEMS) device is provided. The device comprises a central MEMS wafer, and top and bottom cap wafers. The MEMS wafer includes a MEMS structure, such as an inertial sensor. The 5 top cap wafer, the bottom cap wafer and the MEMS wafers are stacked along a stacking axis and together form at least one hermetic cavity enclosing the MEMS structure. At least one of the top cap wafer and the bottom cap wafer is a silicon-on-insulator (SOI) cap wafer comprising a cap device layer, a cap handle layer and a cap insulating layer interposed between the cap device layer and the cap handle layer. At 10 least one electrically conductive path extends through the SOI cap wafer, establishing an electrical convection between an outer electrical contact provided on the SOI cap wafer and the MEMS structure.

70 Claims, 15 Drawing Sheets

(51) Int. Cl.
*B81C 1/00* (2006.01)
*G01C 19/5783* (2012.01)

(52) U.S. Cl.
CPC .. *G01C 19/5783* (2013.01); *B81B 2201/0235* (2013.01); *B81B 2201/0242* (2013.01); *B81B 2203/0315* (2013.01); *B81B 2207/095* (2013.01); *B81C 2201/013* (2013.01); *B81C 2203/0118* (2013.01)

(58) Field of Classification Search
CPC . H01L 2224/45144; H01L 2924/01013; H01L 2924/01014; H01L 2924/1461; H01L 2224/48091; H01L 2924/1025; H01L 2924/01322; H01L 2924/00014; H01L 2924/00; H01L 2924/10253; H01L 924/01322
See application file for complete search history.

(56) References Cited

U.S. PATENT DOCUMENTS 4,553,436 A 11/1985 Hansson
4,590,801 A 5/1986 Merhav
4,592,233 A 6/1986 Peters
4,805,456 A 2/1989 Howe et al.
4,833,417 A 5/1989 Schroeder
4,881,408 A 11/1989 Hulsing, II et al.
4,882,933 A 11/1989 Petersen et al.
4,905,523 A 3/1990 Okada
4,967,605 A 11/1990 Okada
5,177,661 A 1/1993 Zavracky et al.
5,235,457 A 8/1993 Lichtman et al.
5,239,984 A 8/1993 Cane et al.
5,359,893 A 11/1994 Dunn
5,557,046 A 9/1996 Hulsing, II
5,596,144 A 1/1997 Swanson
5,608,210 A 3/1997 Esparza et al.
5,614,742 A 3/1997 Gessner et al.
5,623,270 A 4/1997 Kempkes et al.
5,635,639 A 6/1997 Greiff et al.
5,646,346 A 7/1997 Okada
5,662,111 A 9/1997 Cosman
5,777,226 A 7/1998 Ip
5,831,163 A 11/1998 Okada
5,894,090 A 4/1999 Tang et al.
5,895,850 A 4/1999 Buestgens
5,898,223 A 4/1999 Frye et al.
5,920,011 A 7/1999 Hulsing, II
5,959,206 A 9/1999 Ryrko et al.
5,962,784 A 10/1999 Hulsing, II
5,977,640 A 11/1999 Bertin et al.
5,987,985 A 11/1999 Okada
5,992,233 A 11/1999 Clark
6,003,371 A 12/1999 Okada
6,028,773 A 2/2000 Hundt
6,053,057 A 4/2000 Okada
6,058,778 A 5/2000 Chan et al.
6,079,272 A 6/2000 Stell et al.
6,090,638 A 7/2000 Vigna et al.
6,091,132 A 7/2000 Bryant
6,119,517 A 9/2000 Breng et al.
6,122,961 A 9/2000 Geen et al.
6,159,773 A 12/2000 Lin
6,184,052 B1 2/2001 Vigna et al.
6,225,699 B1 5/2001 Ference et al.
6,235,550 B1 5/2001 Chan et al.
6,257,057 B1 7/2001 Hulsing, II
6,282,956 B1 9/2001 Okada
6,295,870 B1 10/2001 Hulsing, II
6,391,673 B1 5/2002 Ha et al.
6,399,997 B1 6/2002 Lin et al.
6,469,330 B1 10/2002 Vigna et al.
6,487,000 B2 11/2002 Mastromatteo et al.
6,490,923 B1 12/2002 Breng et al.
6,508,124 B1 1/2003 Zerbini et al.
6,539,801 B1 4/2003 Gutierrez et al.
6,584,845 B1 7/2003 Gutierrez et al.
6,587,312 B2 7/2003 Murari et al.
6,621,137 B1 9/2003 Ma et al.
6,651,500 B2 11/2003 Stewart et al.
6,675,630 B2 1/2004 Challoner et al.
6,696,364 B2 2/2004 Gelmi et al.
6,701,786 B2 3/2004 Hulsing, II
6,705,167 B2 3/2004 Kvisteroey et al.
6,715,353 B2 4/2004 Johnson
6,718,823 B2 4/2004 Platt
6,766,689 B2 7/2004 Spinola Durante et al.
6,772,632 B2 8/2004 Okada
6,808,952 B1 10/2004 Sniegowski et al.
6,808,955 B2 10/2004 Ma
6,829,937 B2 12/2004 Mahon
6,841,861 B2 1/2005 Brady
6,856,144 B2 2/2005 Lasalandra et al.
6,863,832 B1 3/2005 Wiemer et al.
6,865,943 B2 3/2005 Okada
6,892,575 B2 5/2005 Nasiri et al.
6,925,875 B2 8/2005 Silverbrook
6,939,473 B2 9/2005 Nasiri et al.
6,942,750 B2 9/2005 Chou et al.
6,944,931 B2 9/2005 Shcheglov et al.
6,953,985 B2 10/2005 Lin et al.
6,978,673 B2 12/2005 Johnson et al.
6,990,863 B2 1/2006 Challoner et al.
6,991,957 B2 1/2006 Eskridge
6,993,617 B2 1/2006 Butcher et al.
7,017,410 B2 3/2006 Challoner et al.
7,040,163 B2 5/2006 Shcheglov et al.
7,043,985 B2 5/2006 Ayazi et al.
7,056,757 B2 6/2006 Ayazi et al.
7,093,486 B2 8/2006 Challoner et al.
7,100,448 B2 9/2006 Ikegami
7,104,129 B2 9/2006 Nasiri et al.
7,138,694 B2 11/2006 Nunan et al.
7,159,441 B2 1/2007 Challoner et al.
7,160,752 B2 1/2007 Ouellet et al.
7,168,317 B2 1/2007 Chen et al.
7,168,318 B2 1/2007 Challoner et al.
7,176,556 B2 2/2007 Okamoto et al.
7,180,019 B1 2/2007 Chiou et al.
7,210,351 B2 5/2007 Lo et al.
7,217,588 B2 5/2007 Hartzell et al.
7,238,999 B2 7/2007 LaFond et al.
7,247,246 B2 7/2007 Nasiri et al.
7,250,112 B2 7/2007 Nasiri et al.
7,250,353 B2 7/2007 Nasiri et al.
7,258,008 B2 8/2007 Durante et al.
7,258,011 B2 8/2007 Nasiri et al.
7,258,012 B2 8/2007 Xie
7,275,424 B2 10/2007 Felton et al.
7,291,561 B2 11/2007 Ma et al.
7,318,349 B2 1/2008 Vaganov et al.
7,322,236 B2 1/2008 Combi et al.
7,322,237 B2 1/2008 Kutsuna
7,337,671 B2 3/2008 Ayazi et al.
7,347,095 B2 3/2008 Shcheglov et al.
7,360,423 B2 4/2008 Ayazi et al.
7,402,905 B2 7/2008 Eskridge et al.
7,417,329 B2 8/2008 Chuang et al.
7,442,570 B2 10/2008 Nasiri et al.
7,458,263 B2 12/2008 Nasiri et al.
7,484,410 B2 2/2009 Tsuji et al.
7,491,567 B2 2/2009 DCamp et al.
7,518,493 B2 4/2009 Bryzek et al.
7,541,588 B2 6/2009 Tabirian et al.
7,543,496 B2 6/2009 Ayazi et al.
7,578,189 B1 8/2009 Mehregany
7,615,406 B2 11/2009 Higashi et al.
7,617,729 B2 11/2009 Axelrod et al.
7,621,183 B2 11/2009 Seeger et al.
7,624,494 B2 12/2009 Challoner et al.
7,642,115 B2 1/2010 Eriksen et al.
7,642,657 B2 1/2010 Suilleabhain et al.
7,677,099 B2 3/2010 Nasiri et al.

(56) References Cited

U.S. PATENT DOCUMENTS 7,684,101 B2 3/2010 Border et al.
7,689,321 B2 3/2010 Karlsson
7,690,254 B2 4/2010 Pilchowski et al.
7,694,563 B2 4/2010 Durante et al.
7,748,272 B2 7/2010 Kranz et al.
7,755,367 B2 7/2010 Schoen et al.
7,767,483 B1 8/2010 Waters
7,784,344 B2 8/2010 Pavelescu et al.
7,786,572 B2 8/2010 Chen
7,790,608 B2 9/2010 Lauxtermann et al.
7,795,723 B2 9/2010 Chau et al.
7,810,379 B2 10/2010 DeNatale et al.
7,851,898 B2 12/2010 Nakamura et al.
7,863,698 B2 1/2011 Seeger et al.
7,875,942 B2 1/2011 Cortese et al.
7,882,740 B2 2/2011 Okada
7,886,601 B2 2/2011 Merassi et al.
7,898,043 B2 3/2011 Ziglioli et al.
7,908,921 B2 3/2011 Binda et al.
7,928,632 B2 4/2011 Yang
7,929,143 B2 4/2011 Wilfinger et al.
7,934,423 B2 5/2011 Nasiri et al.
7,964,428 B2 6/2011 Breng et al.
7,971,483 B2 7/2011 Supino et al.
7,982,291 B2 7/2011 Kuisma
7,982,558 B2 7/2011 Sworowski et al.
7,987,714 B2 8/2011 DeNatale et al.
8,042,394 B2 10/2011 Coronato et al.
8,047,075 B2 11/2011 Nasiri et al.
8,049,515 B2 11/2011 Schoen et al.
8,069,726 B2 12/2011 Seeger et al.
8,071,398 B1 12/2011 Yang et al.
8,077,372 B2 12/2011 Border et al.
8,080,869 B2 12/2011 Okudo et al.
8,084,332 B2 12/2011 Nasiri et al.
8,100,012 B2 1/2012 Martin et al.
8,124,895 B2 2/2012 Merassi et al.
8,134,214 B2 3/2012 Baldo et al.
8,151,640 B1 4/2012 Kubena
8,166,816 B2 5/2012 Ayazi et al.
8,176,782 B2 5/2012 Furukubo et al.
8,220,328 B2 7/2012 Rudolf et al.
8,227,285 B1 7/2012 Yang et al.
8,227,911 B1 7/2012 Yang et al.
8,230,740 B2 7/2012 Katsuki et al.
8,236,577 B1 8/2012 Hsu et al.
8,258,590 B2 9/2012 Geiger et al.
8,272,266 B2 9/2012 Zhang et al.
8,283,737 B2 10/2012 Sugizaki
8,289,092 B2 10/2012 Pomarico et al.
8,297,121 B2 10/2012 Quer et al.
8,314,483 B2 11/2012 Lin et al.
8,324,047 B1 12/2012 Yang
8,347,717 B2 1/2013 Seeger et al.
8,350,346 B1 1/2013 Huang et al.
8,365,595 B2 2/2013 Geiger et al.
8,368,153 B2 2/2013 Huang et al.
8,372,677 B2 2/2013 Mehregany
8,375,789 B2 2/2013 Prandi et al.
8,384,134 B2 2/2013 Daneman et al.
8,390,173 B2 3/2013 Yoshihara et al.
8,395,252 B1 3/2013 Yang
8,395,381 B2 3/2013 Lo et al.
8,402,666 B1 3/2013 Hsu et al.
8,405,170 B2 3/2013 Kohl et al.
8,407,905 B1 4/2013 Hsu et al.
8,413,506 B2 4/2013 Coronato et al.
8,421,082 B1 4/2013 Yang
8,426,961 B2 4/2013 Shih et al.
8,432,005 B2 4/2013 Yang et al.
8,433,084 B2 4/2013 Conti et al. ..... H04R 19/005 381/174
8,445,307 B2 5/2013 Yeh et al.
8,459,093 B2 6/2013 Donadel et al.
8,459,110 B2 6/2013 Cazzaniga et al.
8,461,935 B2 6/2013 McCraith et al.
8,481,365 B2 7/2013 Verhelijden et al.
8,486,744 B2 7/2013 Lin et al.
8,487,444 B2 7/2013 Law et al.
8,490,461 B2 7/2013 Sasaki et al.
8,490,483 B2 7/2013 Wrede et al.
8,497,557 B2 7/2013 Tanaka et al.
8,508,039 B1 8/2013 Nasiri et al.
8,508,045 B2 8/2013 Khan et al.
8,513,747 B1 8/2013 Huang et al.
8,519,537 B2 8/2013 Jeng et al.
8,567,246 B2 10/2013 Shaeffer et al.
8,569,090 B2 10/2013 Taheri
8,587,077 B2 11/2013 Chen
8,593,036 B2 11/2013 Boysel
8,614,110 B1 12/2013 Waters et al.
8,637,943 B1 1/2014 Yang
8,652,961 B1 2/2014 Yang
8,675,181 B2 3/2014 Hall
8,685,776 B2 4/2014 LaFond et al.
8,704,238 B2 4/2014 Yang et al.
8,748,206 B2 6/2014 Horning
8,759,926 B2 6/2014 Fujii et al.
8,810,030 B2 8/2014 Geisberger
8,826,514 B2 9/2014 Papavasiliou et al.
8,869,616 B1 10/2014 Sridharamurthy et al.
8,885,170 B2 11/2014 Kilic et al.
8,919,199 B2 12/2014 Judy et al.
8,921,145 B2 12/2014 Shu et al.
RE45,439 E 3/2015 Prandi et al.
9,013,233 B2 4/2015 Elmallah et al.
9,046,541 B1 6/2015 Kubena et al.
9,061,891 B2 6/2015 Supino et al.
9,063,549 B1 6/2015 Pennecot et al.
9,085,455 B2 7/2015 Cheng et al.
9,309,106 B2 4/2016 Boysel et al.
9,340,414 B2 5/2016 Yoneoka et al.
9,409,768 B2 8/2016 DeNatale et al.
9,499,397 B2 11/2016 Bowles et al.
9,567,204 B2 2/2017 Hung et al.
9,594,128 B2 3/2017 Farghaly et al.
9,709,595 B2 7/2017 Vohra et al.
9,751,754 B2 9/2017 Kurashima et al.
9,784,835 B1 10/2017 Droz et al.
9,837,935 B2 12/2017 Johnson et al.
9,869,754 B1 1/2018 Campbell et al.
9,945,950 B2 4/2018 Newman et al.
10,214,414 B2 2/2019 Boysel et al.
10,273,147 B2 4/2019 Boysel
10,407,299 B2 9/2019 Boysel
10,768,065 B2 9/2020 Boysel et al.
11,287,486 B2 3/2022 Boysel
11,579,033 B2 2/2023 Boysel et al.
11,674,803 B2 6/2023 Boysel et al.
2001/0011994 A1 8/2001 Morimoto et al.
2002/0040602 A1 4/2002 Okada
2003/0094046 A1 5/2003 Okada
2003/0209075 A1 11/2003 Okada
2004/0052016 A1 3/2004 Takagi et al.
2004/0063239 A1 4/2004 Yun et al.
2004/0211258 A1 10/2004 Geen
2004/0224279 A1 11/2004 Siemons
2004/0231422 A1 11/2004 Okada
2005/0076719 A1 4/2005 Jakobsen et al.
2005/0166677 A1 8/2005 Nasiri et al.
2005/0210981 A1 9/2005 Okada
2005/0242991 A1 11/2005 Montgomery et al.
2006/0163453 A1 7/2006 Hynes et al.
2006/0163679 A1* 7/2006 LaFond ..... G01P 1/023 257/414
2006/0179941 A1 8/2006 Okada
2006/0180896 A1 8/2006 Martin et al.
2006/0185428 A1 8/2006 Combi et al.
2006/0231521 A1 10/2006 Chilcott
2006/0266118 A1 11/2006 Denison et al.
2007/0125161 A1 6/2007 Bryzek et al.
2007/0180912 A1 8/2007 Judy et al.
2007/0214886 A1 9/2007 Sheynblat
2007/0273018 A1 11/2007 Onozuka et al.

(56) References Cited

U.S. PATENT DOCUMENTS

2007/0279885 A1 12/2007 Basavanhally et al.
2007/0297631 A1 12/2007 Miles
2008/0098814 A1 5/2008 Platt et al.
2008/0283990 A1 11/2008 Nasiri et al.
2008/0289417 A1 11/2008 Okada
2008/0290490 A1 11/2008 Fujii et al.
2009/0114016 A1 5/2009 Nasiri et al.
2009/0199637 A1 8/2009 Sugiura et al.
2009/0255335 A1 10/2009 Fly et al.
2009/0297770 A1 12/2009 Yoshida et al.
2010/0072626 A1 3/2010 Theuss et al.
2010/0084752 A1 4/2010 Horning et al.
2010/0132460 A1 6/2010 Seeger et al.
2010/0164086 A1 7/2010 Noma et al.
2010/0176466 A1 7/2010 Fujii et al.
2010/0182418 A1 7/2010 Jess et al.
2010/0212425 A1 8/2010 Hsu et al.
2010/0218977 A1 9/2010 Inoue et al.
2010/0259130 A1 10/2010 Eckstein et al.
2010/0324366 A1 12/2010 Shimotsu
2011/0012248 A1 1/2011 Reichenbach et al.
2011/0016972 A1 1/2011 Reinert
2011/0030473 A1 2/2011 Acar
2011/0219876 A1 9/2011 Kalnitsky et al.
2011/0227173 A1 9/2011 Seppala et al.
2011/0228906 A1 9/2011 Jaffray et al.
2012/0006789 A1 1/2012 DeNatale et al.
2012/0032286 A1 2/2012 Trusov et al.
2012/0042731 A1 2/2012 Lin et al.
2012/0048017 A1 3/2012 Kempe
2012/0091854 A1 4/2012 Kaajakari
2012/0137774 A1 6/2012 Judy et al.
2012/0142144 A1 6/2012 Taheri
2012/0227487 A1 9/2012 Ayazi et al.
2012/0261822 A1 10/2012 Graham et al.
2012/0272734 A1 11/2012 Jeung et al.
2012/0280594 A1* 11/2012 Chen ..... H03H 3/007 310/313 R
2012/0291547 A1 11/2012 Kim et al.
2012/0300050 A1 11/2012 Korichi et al.
2012/0326248 A1* 12/2012 Daneman ..... B81B 7/02 257/415
2013/0009803 A1 1/2013 Edvardsson
2013/0019678 A1 1/2013 Lazaroff et al.
2013/0019680 A1 1/2013 Kittilsland et al.
2013/0100271 A1 4/2013 Howes
2013/0105921 A1 5/2013 Najafi et al.
2013/0115729 A1 5/2013 Silverbrook et al.
2013/0119492 A1 5/2013 Feiertag et al.
2013/0126992 A1 5/2013 Ehrenpfordt et al.
2013/0146994 A1 6/2013 Kittilsland et al.
2013/0147020 A1 6/2013 Gonska et al.
2013/0168740 A1 7/2013 Chen
2013/0181355 A1 7/2013 Tsai et al.
2013/0192363 A1 8/2013 Loreck et al.
2013/0192369 A1 8/2013 Acar et al.
2013/0210175 A1 8/2013 Hoisington et al.
2013/0221454 A1 8/2013 Dunbar, III et al.
2013/0241546 A1 9/2013 Fu
2013/0253335 A1 9/2013 Noto et al.
2013/0270657 A1 10/2013 Acar
2013/0277773 A1 10/2013 Bryzek et al.
2013/0285165 A1 10/2013 Classen et al.
2013/0299924 A1 11/2013 Weber et al.
2013/0315036 A1 11/2013 Paulson et al.
2013/0341737 A1 12/2013 Bryzek et al.
2014/0007685 A1 1/2014 Zhang et al.
2014/0090469 A1 4/2014 Comi et al.
2014/0090485 A1 4/2014 Feyh et al.
2014/0091405 A1 4/2014 Weber
2014/0092460 A1 4/2014 Schwedt et al.
2014/0116135 A1 5/2014 Cazzaniga et al.
2014/0116136 A1 5/2014 Coronato et al.
2014/0124958 A1 5/2014 Bowles et al.
2014/0125325 A1 5/2014 Ocak et al.
2014/0125359 A1 5/2014 El-Gamal et al.
2014/0137648 A1 5/2014 Zolfagharkhani et al.
2014/0138853 A1 5/2014 Liu et al.
2014/0162393 A1 6/2014 Yang
2014/0166463 A1 6/2014 Jahnes et al.
2014/0183729 A1 7/2014 Bowles
2014/0186986 A1 7/2014 Shu et al.
2014/0193949 A1 7/2014 Wu
2014/0203421 A1 7/2014 Shu et al.
2014/0210019 A1 7/2014 Nasiri et al.
2014/0227816 A1 8/2014 Zhang et al.
2014/0230548 A1 8/2014 Coronato et al.
2014/0231936 A1 8/2014 Jahnes et al.
2014/0231938 A1 8/2014 Campedelli et al.
2014/0260612 A1 9/2014 Aono et al.
2014/0260617 A1 9/2014 Ocak et al.
2014/0264648 A1 9/2014 Chu et al.
2014/0264650 A1 9/2014 Liu et al.
2014/0283605 A1 9/2014 Baldasarre et al.
2014/0287548 A1 9/2014 Lin et al.
2014/0291128 A1 10/2014 Kwa
2014/0311242 A1 10/2014 Lee et al.
2014/0311247 A1 10/2014 Zhang et al.
2014/0318906 A1 10/2014 Deimerly et al.
2014/0319630 A1 10/2014 Conti et al.
2014/0322854 A1 10/2014 Nakatani et al.
2014/0326070 A1 11/2014 Neul et al.
2014/0331769 A1 11/2014 Fell
2014/0339654 A1 11/2014 Classen
2014/0339656 A1 11/2014 Schlarmann et al.
2014/0349434 A1 11/2014 Huang et al. ..... B81C 1/00269 438/51
2014/0352433 A1 12/2014 Hammer
2014/0353775 A1 12/2014 Formosa et al.
2014/0357007 A1 12/2014 Cheng et al.
2014/0370638 A1 12/2014 Lee et al.
2014/0374850 A1 12/2014 Chen et al.
2014/0374854 A1 12/2014 Xue
2014/0374917 A1 12/2014 Weber et al.
2014/0374918 A1 12/2014 Weber et al.
2015/0008545 A1 1/2015 Quevy et al.
2015/0115376 A1 4/2015 Chen et al.
2015/0191345 A1 7/2015 Boysel et al.
2015/0198493 A1 7/2015 Kaelberer et al.
2015/0260519 A1 9/2015 Boysel et al.
2015/0329351 A1 11/2015 Cheng et al.
2015/0330782 A1 11/2015 Johnson et al.
2015/0353346 A1 12/2015 Heuck et al.
2015/0371390 A1 12/2015 Gassner et al.
2016/0003923 A1 1/2016 Zieren et al.
2016/0060104 A1* 3/2016 Chu ..... B81C 1/00309 257/416
2016/0229684 A1 8/2016 Boysel
2016/0229685 A1 8/2016 Boysel
2016/0289063 A1 10/2016 Ocak et al.
2016/0320426 A1 11/2016 Boysel et al.
2016/0327446 A1 11/2016 Classen et al.
2017/0030788 A1 2/2017 Boysel et al.
2017/0108336 A1 4/2017 Boysel et al.
2017/0363694 A1 12/2017 Boysel
2018/0074090 A1 3/2018 Boysel
2021/0198096 A1 7/2021 Borca-Tasciuc et al.

FOREIGN PATENT DOCUMENTS

EP 1819012 A2 8/2007
EP 2410344 A2 1/2012
EP 2544302 A1 1/2013
EP 2693182 A1 2/2014
EP 2693183 A1 2/2014
EP 3019442 A1 5/2016
JP 2008-114354 A 5/2008
JP 2008-132587 A 6/2008
JP 2009-245877 A 10/2009
JP 2011-194478 A 10/2011
JP 2012-247192 A 12/2012
JP 2013-030759 A 2/2013
JP 2013-164285 A 8/2013
WO WO-2008/086530 A2 7/2008

(56) References Cited

FOREIGN PATENT DOCUMENTS

| | | | | |
|---|---|---|---|---|
| WO | 2009/009803 | A2 | 1/2009 | |
| WO | WO-2009/057990 | A2 | 5/2009 | |
| WO | WO-2011/151098 | A2 | 12/2011 | |
| WO | 2012/037539 | A1 | 3/2012 | |
| WO | WO-2013/116356 | A1 | 8/2013 | |
| WO | WO-2014/122910 | A1 | 8/2014 | |
| WO | WO-2014/159957 | A1 | 10/2014 | |
| WO | WO-2014/177542 | A1 | 11/2014 | |
| WO | WO-2014/184025 | A1 | 11/2014 | |
| WO | WO-2015/003264 | A1 | 1/2015 | |
| WO | WO-2015/013827 | A1 | 2/2015 | |
| WO | WO-2015/013828 | A1 | 2/2015 | |
| WO | WO 2015038078 | A1 * | 3/2015 | ..... B81C 1/00301 |
| WO | WO-2015/042700 | A1 | 4/2015 | |
| WO | WO-2015/042701 | A1 | 4/2015 | |
| WO | WO-2015/042702 | A1 | 4/2015 | |
| WO | WO-2015/103688 | A1 | 7/2015 | |
| WO | WO-2015/154173 | A1 | 10/2015 | |

OTHER PUBLICATIONS

Merdassi et al., Design and Fabrication of 3-Axis Accelerometer Sensor Microsystem for Wide Temperature Range Applications Using Semi-Custom Process. Proc of SPIE. Mar. 2014;8973:89730O-1-89730O-12.

Merdassi et al., Design of 3-axis Capacitive Low-Gravity MEMS Accelerometer with Zero Cross-Axis Sensitivity in a Commercial Process. NSTI-Nanotech, www.nsti.org. Jan. 2013;2:185-188.

Merdassi et al., Wafer level vacuum encapsulated tri-axial accelerometer with low cross-axis sensitivity in a commercial MEMS Process. Sensors and Actuators A. Oct. 2015;236:25-37.

Boysel, A Single-Proof-Mass MEMS Multi-Axis Motion Sensor. Semicon Japan. 6 pages. (2008).

Boysel et al., Development of a Single-Mass Five-Axis MEMS Motion Sensor. Virtus Advanced Sensors, Inc., 17 pages. (May 2009).

Boysel, White Paper Series: Virtus Sensor Technology. Virtus Advanced Sensors. Semicon Japan, 11 pages. Nov. 11, 2008.

Watanabe et al., SOI micromachined 5-axis motion sensor using resonant electrostatic drive and non-resonant capacitive detection mode. Sensor and Actuators A. 2006;130-131:116-123.

European Search Report for Application No. 14822259.9 dated Jan. 4, 2017.

International Search Report and Written Opinion for Application No. PCT/CA2014/050729, dated Nov. 3, 2014.

International Search Report and Written Opinion for Application No. PCT/CA2014/050902, dated Dec. 15, 2014.

International Search Report and Written Opinion for Application No. PCT/CA2014/050904, dated Dec. 1, 2014.

International Search Report and Written Opinion for Application No. PCT/CA2014/050910, dated Dec. 22, 2014.

International Search Report and Written Opinion for Application No. PCT/CA2014/051245, dated Feb. 25, 2015.

International Search Report and Written Opinion for Application No. PCT/CA2015/050018, dated Apr. 20, 2015.

International Search Report and Written Opinion for Application No. PCT/CA2015/050026, dated Apr. 27, 2015.

International Search Report and Written Opinion for Application No. PCT/CA2016/050303, dated Jun. 13, 2016. 7 pages.

International Search Report for Application No. PCT/CA2016/050031, dated Mar. 16, 2016. 3 pages.

International Search Report for Application No. PCT/CA2014/050730, dated Nov. 3, 2014. 3 pages.

Supplementary European Search Report for Application No. 14831791.0, dated Jun. 12, 2017, 8 pages.

International Search Report and Written Opinion for Application No. PCT/US2017/015393, dated Apr. 26, 2017. 17 pages.

U.S. Appl. No. 14/622,548, filed Feb. 13, 2015, 2015-0260519, published.

U.S. Appl. No. 15/024,711, filed Mar. 24, 2016, 2016-0229685, published.

U.S. Appl. No. 15/024,704, filed Mar. 24, 2016, 2016-0229684, published.

U.S. Appl. No. 15/206,935, filed Jul. 11, 2016, 10,214,414, Issued.

U.S. Appl. No. 16/283,002, filed Feb. 22, 2019, pending.

U.S. Appl. No. 15/302,731, filed Oct. 7, 2016, 2017-0030788, published.

U.S. Appl. No. 15/315,894, filed Dec. 2, 2016, 2017-0108336, published.

U.S. Appl. No. 16/046,764, filed Jul. 26, 2018, pending.

U.S. Appl. No. 15/534,702, filed Jun. 9, 2017, 2017-0363694, published.

U.S. Appl. No. 15/558,807, filed Jul. 14, 2017, 2018-0074090, published.

U.S. Appl. No. 14/622,619, filed Feb. 13, 2015, 9,309,106, issued.

* cited by examiner

3D MEMS DEVICE WITH HERMETIC CAVITY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED PATENT APPLICATIONS

This patent application is a *Re-Issue Application of U.S. Pat. No. 10,407,299, application Ser. No. 15/543,700, filed Jul. 14, 2017, which is a* 35 U.S.C. § 371 national stage filing of International Application No. PCT/CA2016/050031, filed Jan. 14, 2016, which in turn claims priority to U.S. Provisional patent application Ser. Nos. 62/103,825, filed Jan. 15, 2015 and 62/138,161, filed Mar. 25, 2015, the above applications being incorporated herein by reference in their entirety.

TECHNICAL FIELD

The general technical field relates to micro-electro-mechanical systems (MEMS), and more particularly, to a MEMS device using silicon-on-insulator (SOI) technology, and to associated fabrication methods.

BACKGROUND

MEMS devices, in particular inertial sensors such as accelerometers and angular rate sensors or gyroscopes, are being used in a steadily growing number of applications. As the number of these applications grows, the greater the demand to add additional functionality and more types of MEMS into a system chip architecture. Due to the significant increase in consumer electronics applications for MEMS sensors such as optical image stabilization (OIS) for cameras embedded in smart phones and tablet PCs, virtual reality systems and wearable electronics, there has been a growing interest in utilizing such technology for more advanced applications which have been traditionally catered to by much larger, more expensive and higher grade non-MEMS sensors. Such applications include single- and multiple-axis devices for industrial applications, inertial measurement units (IMUs) for navigation systems and attitude heading reference systems (AHRS), control systems for unmanned air, ground and sea vehicles and for personal indoor and even GPS-denied navigation. These applications also may include healthcare/medical and sports performance monitoring and advanced motion capture systems for next generation virtual reality. These advanced applications often require lower bias drift and higher sensitivity specifications well beyond the capability of existing consumer-grade MEMS inertial sensors on the market. In order to expand these markets and to create new ones, it is desirable and necessary that higher performance specifications be developed. It is also necessary to produce a low cost and small size sensor and/or MEMS inertial sensor-enabled system(s).

Given that MEMS inertial sensors such as accelerometers and gyroscopes are typically much smaller than traditional mechanical gyroscopes, they tend to be subject to higher mechanical noise and drift. Also, since position and attitude are calculated by integrating the acceleration and angular rate data, respectively, noise and drift can lead to growing errors. Consequently, for applications requiring high accuracy, such as navigation, it is generally desirable to augment the six-degree-of-freedom (6DOF) inertial capability of MEMS motion sensors (i.e., three axes of acceleration and three axes of angular rotation) with other position- and/or orientation-dependent measurements. By way of example, barometric pressure measurements can provide additional information about altitude, while magnetic field measurements can provide additional information about position on the Earth's surface and motion relative to the Earth's magnetic field. Thus, for MEMS inertial sensor systems, as well as other MEMS sensor systems, it is attractive to integrate more types of sensors onto a single chip.

The MEMS devices that measure these parameters include a MEMS mechanical element (e.g. proof mass, pressure-sensitive membrane, or magnetic transducer) that is free to move in response to a particular measured or stimulus. Additionally, since MEMS transducers are by design sensitive to some environmental influences, the packaging surrounding a MEMS transducer should protect it from undesired environmental influences. Thus the MEMS package surrounding the transducer should provide a hermetic, and in some cases a vacuum, environment while at the same time enabling electrical contact between the enclosed sensors and their corresponding IC electronics. In the past this has been accomplished by packaging the MEMS and IC side by side, fabricating the MEMS directly on the IC, or stacking the MEMS and IC, followed by attaching the MEMS and IC to a package substrate, protecting the MEMS with a non-functional silicon or glass cap, using wire bonds to make electrical connection to the IC and package substrate, and covering the substrate with a molded plastic cap. This chip-scale packaging adds considerable expense to the final device and makes chip stacking for 3DIC applications difficult, if not impossible.

Efforts have been made to include electrical feedthroughs through the cap over MEMS sensors, such as copper-filled or polysilicon-filled through-silicon-vias (TSVs). These TSVs consist of holes etched in the silicon that are lined with an insulator (e.g., thermal silicon dioxide), and then filled with a conductor (e.g., copper or polysilicon). In order to completely fill the TSV while limiting the diameter of the holes and, thus, the thickness of the fill material, the depth of the holes generally does not exceed about 100 micrometers (μm). The thickness of the MEMS cap is thus also limited to around 100 micrometers, rendering it susceptible to flexing due to pressure differences between the inside and the outside of the package, and also to external mechanical and thermal stresses. This flexing can cause delamination and cracking in the thin film layers of the TSVs which, in turn, can lead to leaks of air and moisture into the package and destroy or degrade its hermeticity.

Also, the performance of MEMS sensors generally depends on their operating environment, particularly the pressure environment. For example, resonant devices such as gyroscopes, silicon clocks and magnetometers typically operate at low or even vacuum pressures to minimize air damping and improve the quality factor of the resonance. Accelerometers, on the other hand, generally require some air damping to lower their ringing response to external impulse forces and enhance the response to the slowly varying accelerations of interest. Pressure sensors and microphones generally require access or exposure to the ambient pressure environment outside the sensor and may contain in their interiors gas of either high or low pressure, depending upon the application. In addition, for wafer level packaging of MEMS sensors, the pressure inside the sensor is typically determined by the ambient pressure at the time of wafer bonding. Thus, every sensor on the wafer is generally sealed in an environment at the same pressure. In order to integrate different sensors requiring different ambient pressures on the same chip, it may be needed or desirable to provide for each sensor an individual micro-environment at a desired pressure.

Accordingly, challenges remain in the development of methods for packaging MEMS devices. In light of the preceding, there is a need for an improved MEMS device and related fabrication process.

SUMMARY

In accordance with an aspect, a three dimensional (3D) micro-electro-mechanical system (MEMS) device is provided. The device comprises a MEMS wafer, and top and bottom cap wafers. The MEMS wafer includes one or more MEMS structure(s), which can include or be embodied by any sensing and/or control element or combinations thereof such as, but not limited to, membranes, diaphragms, proof masses, actuators, transducers, micro-valves, micro-pumps, and the like. The MEMS wafer has opposed first and second sides. The top cap wafer and the bottom cap wafer are respectively bonded to the first side and the second side of the MEMS wafer. The top cap wafer, the bottom cap wafer and the MEMS wafer are stacked along a stacking axis and they form together at least one hermetic cavity enclosing the MEMS structure. A MEMS structure can comprise substructures or elements contained in a cavity or chamber of the device. At least one of the top cap wafer and the bottom cap wafer is a silicon-on-insulator (SOI) cap wafer comprising a cap device layer, a cap handle layer and a cap insulating layer interposed between the cap device layer and the cap handle layer. One of the cap handle layer and of the cap device layer has its inner side bonded to the MEMS wafer, and the other one of the cap handle layer and of the cap device layer has its outer side provided with outer electrical contacts formed thereon. At least one electrically conductive path extends through the cap handle layer and through the cap device layer of the SOI cap wafer, to establish an electrical connection between one of the outer electrical contacts and the MEMS structure. Preferably, both the top and the bottom cap wafers are SOI wafers.

In possible embodiments, the electrically conductive path comprises a conducting shunt, formed through the cap insulating layer, electrically connecting the cap handle layer and the cap device layer. A conducting shunt can be formed by etching a via or small area in the insulating layer, and by depositing a conductive material therein, to electrically connect the device and handle layers of the SOI cap wafer.

In possible embodiments, the electrically conductive path comprises a post formed in the cap handle layer, the post being delineated by a closed-loop trench patterned through the entire thickness of the cap handle layer. In this embodiment, one of the electrical contacts is located on top of said post.

In possible embodiments, the electrically conductive path comprises a pad formed in the cap device layer, the pad being delineated by a trench patterned through an entire thickness of the cap device layer, the pad being aligned with the post. It will be noted that by "aligned with" it is meant the pad and post are opposite each other along an axis parallel to the stacking axis, such that at least a portion of the pad faces at least a portion of the post.

In possible embodiments, the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer.

In possible embodiments, the electrically conductive path comprises a pad formed in the MEMS device layer, delineated by a trench, the pad being electrically connected to the MEMS structure, the pad formed in the MEMS device layer being aligned with the pad formed in the cap device layer.

In possible embodiments, the MEMS wafer comprises an outer frame, and the MEMS structure comprises at least one proof mass suspended by springs. The at least one proof mass is patterned in both the MEMS handle and device layers, and the springs are patterned in the MEMS device layer. This at least one proof mass includes conductive shunts electrically connecting the MEMS device and handle layers, and the electrically conductive path connects one of the electrical contacts to the MEMS structure via at least one of the springs. In possible embodiments, the electrically conductive path connecting an outer electrical contact located on the SOI cap wafer to the MEMS structure includes a post patterned in the cap handle layer, a pad patterned in the cap device layer, and a conductive shunt formed in the cap insulating layer, to connect the post with the pad; a pad patterned in the MEMS device layer, the pad being part of an outer frame; a spring patterned in the MEMS device layer, the spring suspending the MEMS structure in the hermetic cavity.

In possible embodiments, the cap device layer comprises cap electrodes patterned therein. The 3D MEMS device comprises additional electrically conductive paths, which are not connected to the MEMS structures but are connected to electrodes provided in one of the caps. These additional electrically conductive paths extend through the cap handle layer and through the cap device layer. The portion of the path extending in the cap can be referred to as "cap feedthrough". At least some of the additional electrically conductive paths establish an electrical connection between a subset of the outer electrical contacts and the cap electrodes. The cap electrodes can be located in either one of the cap wafers, and preferably in both caps.

In possible embodiments, the cap device layer comprises leads patterned therein. The leads are electrically connected to some of the cap electrodes. The leads extend orthogonally to the stacking axis, and they form part of corresponding additional electrically conducting paths.

In possible embodiments, a device feedthrough extends along the stacking axis in the device. The device feedthrough comprises at least one cap feedthrough and a MEMS feedthrough aligned with one another. In embodiments where both cap wafers are provided with outer electrical contacts, a device feedthrough may comprise a first or top cap feedthrough, a MEMS feedthrough and a second or bottom cap feedthrough. A cap feedthrough comprises a cap feedthrough post patterned through the entire thickness of the cap handle layer, and electrically connected to one of the outer electrical contacts; a cap feedthrough pad patterned through the entire thickness of the cap device layer and facing the cap feedthrough post; and a cap conductive shunt formed through the cap insulating layer, electrically connecting the cap feedthrough post and the cap feedthrough pad. A MEMS feedthrough comprises a MEMS feedthrough post patterned through an entire thickness of the MEMS handle layer; a MEMS feedthrough pad patterned through an entire thickness of the MEMS device layer; and a MEMS conductive shunt formed through the MEMS insulating layer, electrically connecting the MEMS feedthrough post and the MEMS feedthrough pad. In cases where both cap wafers are provided with outer electrical contacts, they are located on the respective cap feedthrough posts, and the device feedthrough allows to connect the electrical contact of the top cap wafer to the electrical contact of the bottom cap wafer. In possible embodiments, the electrical contact on the SOI cap(s) are bond pads.

In some embodiments, the trenches delineating posts in at least one of the SOI cap wafer and the SOI MEMS wafer are left empty or unfilled.

In some embodiments, the cap feedthrough post and the MEMS feedthrough post which are aligned with one another have respective cross-sections, taken orthogonally with respect to the stacking axis. These cross-sections are of different sizes. Advantageously, having either one of the post or pad wider may limit potential leakage along the stacking axis.

In some embodiments, the cap device layer is a single crystal silicon layer. Still in possible embodiments, the cap handle layer has a thickness between 100 μm and 800 μm, and preferably between 200 μm and 800 μm.

In possible embodiments, the 3D MEMS device includes more than one cavity. The hermetic cavity enclosing the MEMS structure can be a first cavity, the MEMS structure being a first MEMS structure. The 3D MEMS device can include at least a second cavity enclosing at least a second MEMS structure, the first and second cavities having different internal pressures.

In possible embodiments, a vent extends through one of the top and bottom cap wafers, and defines a gas communication path between the second cavity and an exterior of the MEMS device. Preferably, the first cavity is a hermetically sealed vacuum cavity.

According to another possible aspect of the invention, a method for fabricating a 3D MEMS device is provided. The method can include the following steps:

- providing a top cap wafer, a bottom cap wafer, and a MEMS wafer including a MEMS structure, at least one of the cap wafers being an SOI wafer including a device layer, a handle layer and an insulating layer sandwiched between the handle and device layer;
- forming an electrode in the device layer of each of the top and bottom cap wafers;
- forming, in the top cap wafer, an electrical pathway extending across the insulating layer of the top cap wafer so as to electrically connect the handle layer of the top cap wafer to the electrode formed in the device layer of the top cap wafer;
- forming either:
  - an electrical pathway in the bottom cap wafer that extends across the insulating layer of the bottom cap wafer so as to electrically connect the handle layer of the bottom cap wafer to the electrode formed in the device layer of the bottom cap wafer; or
  - an electrical pathway in the MEMS wafer that extends across the insulating layer of the MEMS wafer so as to electrically connect, via the electrical pathway formed in the top cap wafer, the handle layer of the top cap wafer to electrode formed in the bottom cap wafer; and
- bonding the device layer of the top cap wafer to the device layer of the MEMS wafer and bonding the device layer of the bottom cap wafer to the handle layer of the MEMS wafer, thereby forming a hermetic cavity sealing the MEMS structure.

In other possible embodiments of the fabrication method, a plurality of cavities is formed, each cavity including a MEMS structure. In such embodiments, a vent may be formed in one of the top and bottom SOI cap wafers, to provide at least one cavity at a different internal pressure than the hermetically sealed cavity.

Other features and advantages of the embodiments of the present invention will be better understood upon reading of preferred embodiments thereof with reference to the appended drawings.

Figure 1:
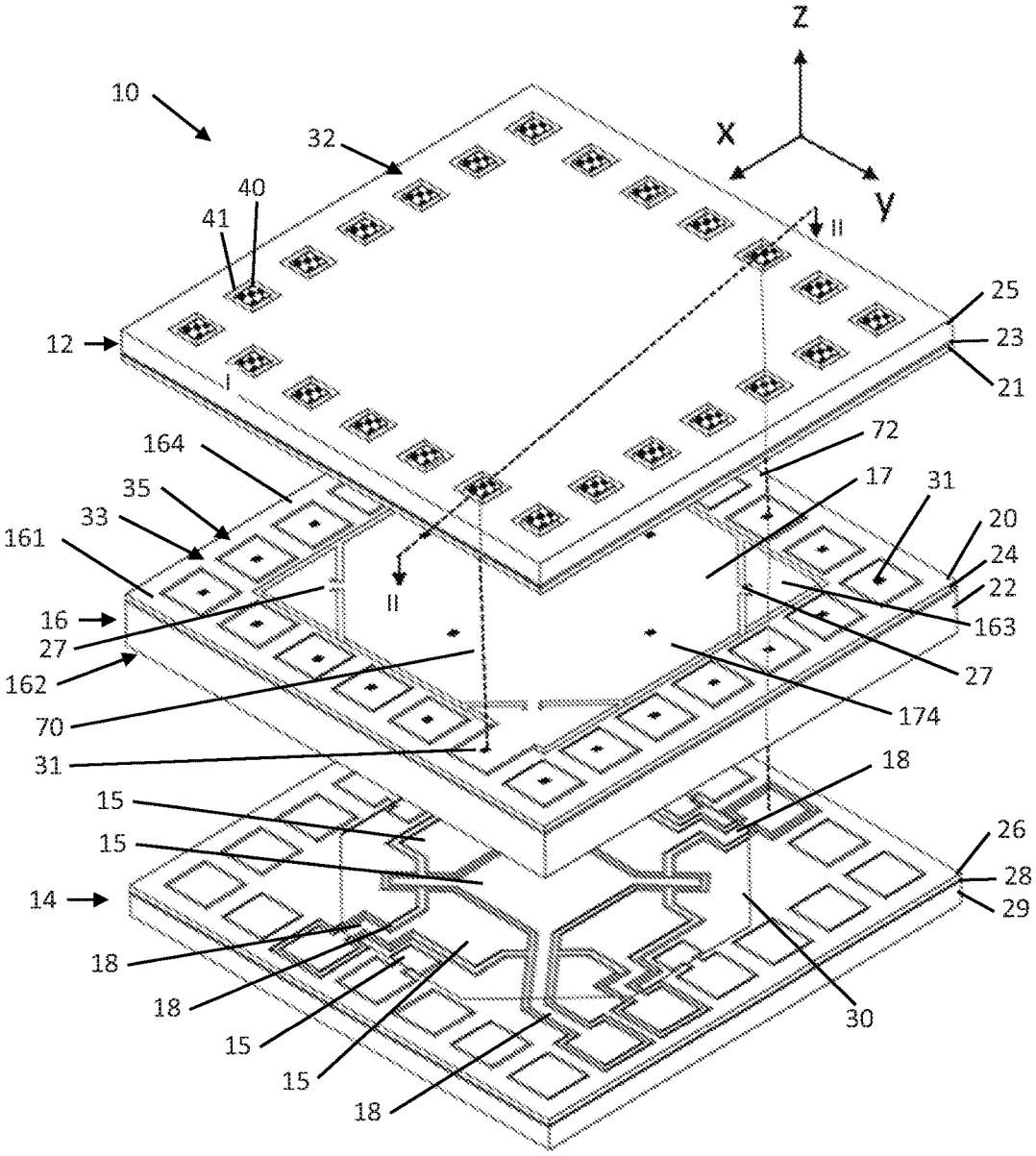
FIG. 1 is an isometric exploded view of a possible embodiment of a 3D MEMS device.

It should be noted that the appended drawings illustrate only exemplary embodiments of the invention, and are therefore not to be construed as limiting of its scope, for the invention may admit to other equally effective embodiments.

DETAILED DESCRIPTION

In the following description, similar features in the drawings have been given similar reference numerals, and, in order to preserve clarity in the drawings, some reference numerals may be omitted when they were already identified in a preceding figure. It should also be understood that the elements of the drawings are not necessarily depicted to scale, since emphasis is placed upon clearly illustrating the elements and structures of the present embodiments. Also, while some of the drawings may illustrate a single device, it will be appreciated that the single device can be one of many chips fabricated in parallel on a single wafer. Consequently, the terms "wafer" and "silicon wafer" may sometimes be used in the present description to refer to a single chip.

Throughout the present description, and unless stated otherwise, positional descriptors such as "top" and "bottom" should be taken in the context of the figures and should not be considered as being limitative. In particular, the terms "top" and "bottom" are used to facilitate reading of the description, and those skilled in the art of MEMS will readily recognize that, when in use, MEMS devices can be placed in different orientations such that the "top face" and the "bottom face" of the proof mass and the "top cap layer" and the "bottom cap layer" of the support assembly are positioned upside down.

The present description generally relates to a 3D MEMS device comprising a first or top cap wafer, a central MEMS wafer and a second or bottom cap wafer stacked vertically along a stacking axis. At least one of the cap wafers is a Silicon-On-Insulator (SOI) cap wafer, and the central MEMS wafer is also preferably a SOI wafer. Preferably, both cap wafers are SOI wafers. The top cap, central and bottom cap wafers define together a cavity or chamber for housing a MEMS structure. It is noted that, in some instances, the terms "chamber" and "cavity" may be used interchangeably. A MEMS structure can include or be embodied by any sensing and/or control element or combinations thereof such as, but not limited to, membranes, diaphragms, proof masses, actuators, transducers, micro-valves, micro-pumps, and the like, including one or more proof masses suspended by flexible springs for example. A MEMS device can also be referred to as a MEMS chip or a MEMS package. The term "3D" refers to the fact that electrical pathways in the device can extend along three orthogonal axes, and are not limited to an "in plane" orientation. As a result, electrical signals can be routed in three dimensions, that is, not only in the plane of the MEMS device, but also across its thickness to allow electrical connections to be established between elements of the MEMS structure and electrical contacts and/or electrodes formed on the outer top and/or bottom and/or lateral sides of the MEMS sensor.

The SOI cap wafer is provided with electrical contacts, and at least one electrically conductive path extends from one of these electrical contacts to the MEMS structure, in view of transmitting signals (e.g., electrical signals such as charges, voltages and/or currents) to and/or from the MEMS structure. It will be understood that the electrical path forms an "insulated" conductive pathway in that it is electrically insulated from the bulk of the conductive SOI cap wafer. An electrically conductive path can thus be formed in the top and/or bottom cap wafers and in the central MEMS wafer by etching trenches in the silicon layers of the wafers, forming posts and pads aligned with one another in the different layers of wafers. An electrically conductive path can also include portions formed of leads extending "horizontally" in the device (i.e., in the plane of the wafers which is perpendicular to the stacking axis). Preferably, a post formed on the top or bottom cap wafer has a cross-section (or transverse area in a plane perpendicular to the stacking axis) of a different size than the size of the cross-section of the corresponding post formed in the central MEMS wafer. This optional configuration provides the advantage that in any cross-section taken along the stacking axis of the device (i.e. when cutting through the top cap wafer, the central MEMS wafer and the bottom cap wafer), there is a layer of silicon part of the outer frame of the 3D MEMS device, thus increasing resistance and robustness of the device to potential leaks to/from the hermetic cavity.

Optionally, the 3D MEMS device can include one or more additional cavities, for housing additional MEMS structures. One of the additional cavities can be provided with a vent.

Embodiments of a 3D MEMS Device

In accordance with an aspect, a 3D MEMS device or package having at least one hermetic cavity or chamber is provided. The exemplary 3D MEMS device is an inertial sensor since it is representative of mechanical, electrical, and vacuum requirements that are generally desired in common practical implementations of MEMS sensor packages. However, the packaging approach described is of more general applicability to other types of MEMS sensors with these requirements and could include, without limitation, pressure sensors, magnetometers, microphones, ultrasonic transducers, and the like.

Figure 2:
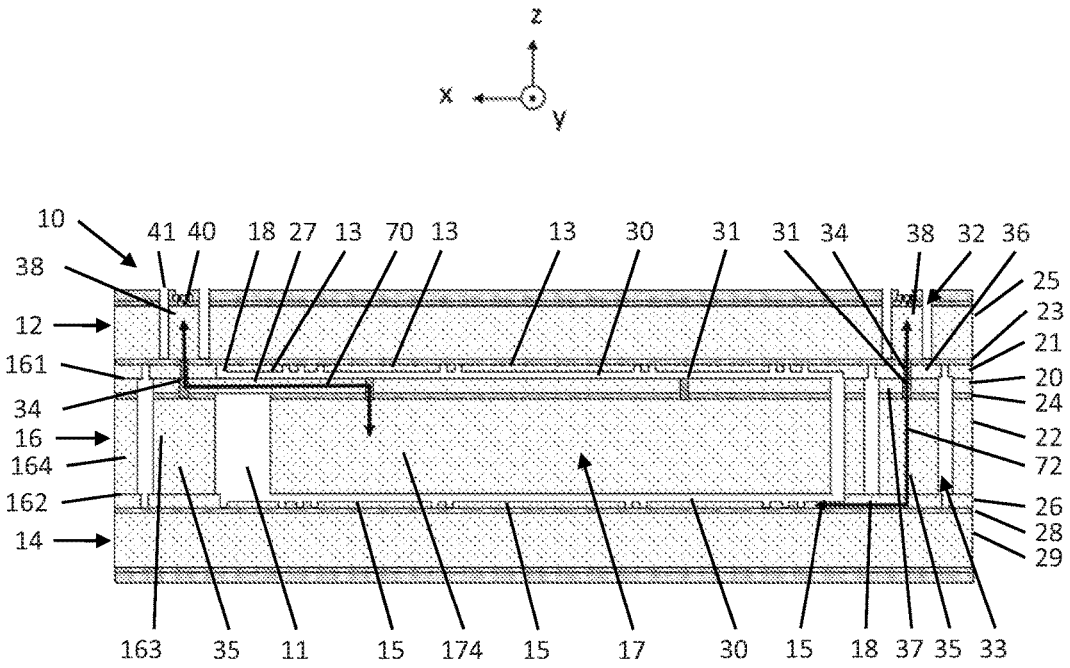
FIG. 2 is a cross section view, taken along section line II-II in FIG. 1, of the 3D MEMS device.

FIG. 1 shows an exploded isometric view of an exemplary embodiment of a three dimensional (3D) micro-electro-mechanical system (MEMS) device 10. In this particular example, the MEMS device is a MEMS inertial sensor fabricated with silicon-on-insulator (SOI) top cap, bottom cap and MEMS wafers, with electrical connections on the top cap wafer. FIG. 2 is a cross-sectional view of the MEMS inertial sensor shown in FIG. 1, taken along line II-II.

Referring to FIGS. 1 and 2, the 3D MEMS device 10 includes three layers made of electrically conductive wafers, which are typically made of silicon: a central MEMS wafer 16, a top or first cap wafer 12; and a bottom or second cap wafer 14. As best shown in FIG. 2, the top cap wafer 12 is bonded to a first side 161 of the MEMS wafer 12, and the bottom cap wafer 14 is bonded to a second side 162 of the MEMS wafer 12. The wafers 12, 16, 14 are stacked along a stacking axis Z, and they form together a hermetic cavity 11, enclosing the MEMS structure 17. An outer frame 164, formed at the periphery of the device 10, surrounds the hermetic cavity 11. While the device 10 shown in FIGS. 1 and 2 only includes one cavity or chamber, it is possible to have a multi-chamber device in other embodiments according to the present invention. In this example, the MEMS structure 17 comprises a proof mass 174 patterned in the MEMS wafer 16, and suspended from support posts 163 by four springs 27, between the cap wafer 12 and the bottom cap wafer 14. In other embodiments, the MEMS structure can include more than one proof mass, or any structure shaped and configured to sense or drive motion. Each cap wafer 12, 14 is provided with drive and sense electrodes 13, 15 disposed to measure the position of the proof mass 174 in 3-dimensional space in response to acceleration and angular velocity. It is to be noted that in other embodiments, each of the top and bottom cap wafers 12, 14 can include a different number of drive and sense electrodes. It is also to be noted that, for simplicity, the expressions "top cap wafer" and "bottom cap wafer" may in some instances be shortened to "top cap" and "bottom cap", respectively.

In the illustrated embodiment, the MEMS wafer 16 is a Silicon-On-Insulator (SOI) wafer, comprising a MEMS device layer 20 bonded to the top cap wafer 12 and a MEMS handle layer 22 bonded to the bottom cap wafer 14. A MEMS insulating layer 24 is interposed between the MEMS device layer 20 and the MEMS handle layer 22. The MEMS device and handle layers 20, 22 are preferably made of single crystal silicon (SCS) and the insulating layer 24 is typically silicon dioxide, often referred to as "buried oxide", sandwiched between the device layer 20 and the handle layer 22. In the embodiment of FIGS. 1 and 2, the MEMS wafer 16 comprises an outer frame 164, formed at the periphery of the device 10. The bulk of the proof mass 174 is patterned in the handle layer 22 of the SOI MEMS wafer 16, and the springs 27 and "top" side of the proof mass are patterned in the device layer 20. The proof mass 174 is suspended by the springs 27 from the support post 163. Because the device and handle layers 20, 22 of the SOI MEMS wafer 16 are separated by an insulating buried oxide layer 24, conducting shunts 31 extending through the buried oxide 24 are used to electrically connect the device and handle layers 20, 22 where required. The caps 12, 14 include one or more recesses which form capacitor gaps 30 between the electrodes 13, 15 on the inner surfaces of the caps 12, 14 and the outer surfaces of the proof mass 174. It is to be understood that, in other embodiments, the MEMS wafer 16 is not limited to the SOI technology but may be based on various other types of materials and structures In this embodiment of the MEMS device 10, both the top 12 and bottom 14 cap wafers are SOI wafers. However, it is possible to have only one of the top and bottom cap wafers 12, 14 made of a SOI wafer. Similar to the MEMS wafer 16, the silicon-on-insulator (SOI) cap wafers 12, 14 comprise respective cap device layers 21, 26; cap handle layers 25, 29 and cap insulating layers 23, 28, each interposed between the cap device layer 21, 26 and the cap handle layer 25, 29. The device and handle layer 21, 25, 26, 29 are electrically conductive, and are made of silicon, preferably SCS, while the insulating layers 23, 28 are made of an electrically insulating material, typically buried oxide. It is preferable and more practical that the device layers 21, 26 be bonded to the first and second sides 162, 162 of the MEMS wafer 16. However, it is possible to have the handle layers 25, 29 of the caps 12, 14 bonded to the MEMS wafer 16 instead. In either case, the outer side of at least one of the top and bottom cap wafer 12, 14 is provided with outer electrical contacts 40 formed thereon. In the example shown in FIGS. 1 and 2, only the top cap wafer 12 is provided with electrical contacts, but in other embodiments, such as the ones shown in FIGS. 3A and 3B, both caps can be provided with electrical contacts.

Figure 2B:
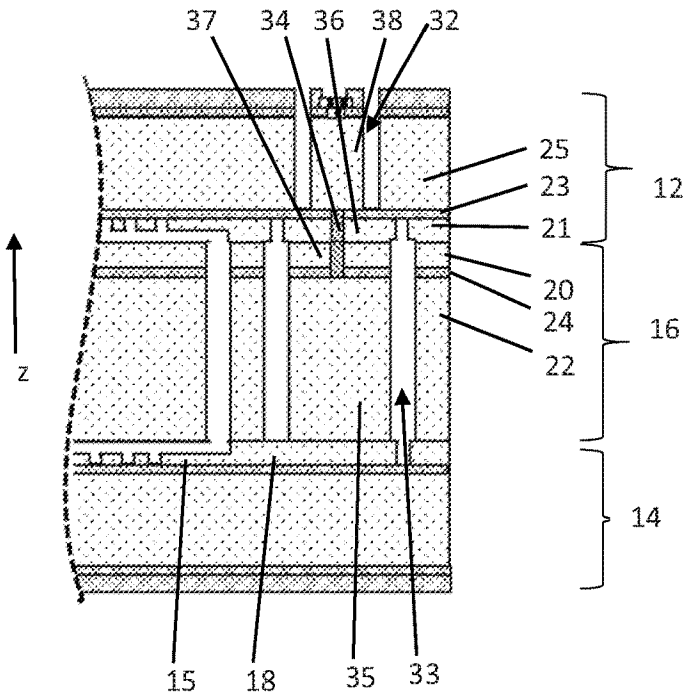
FIGS. 2A and 2B are enlarged views of portions of FIG. 2.
Figure 2A:
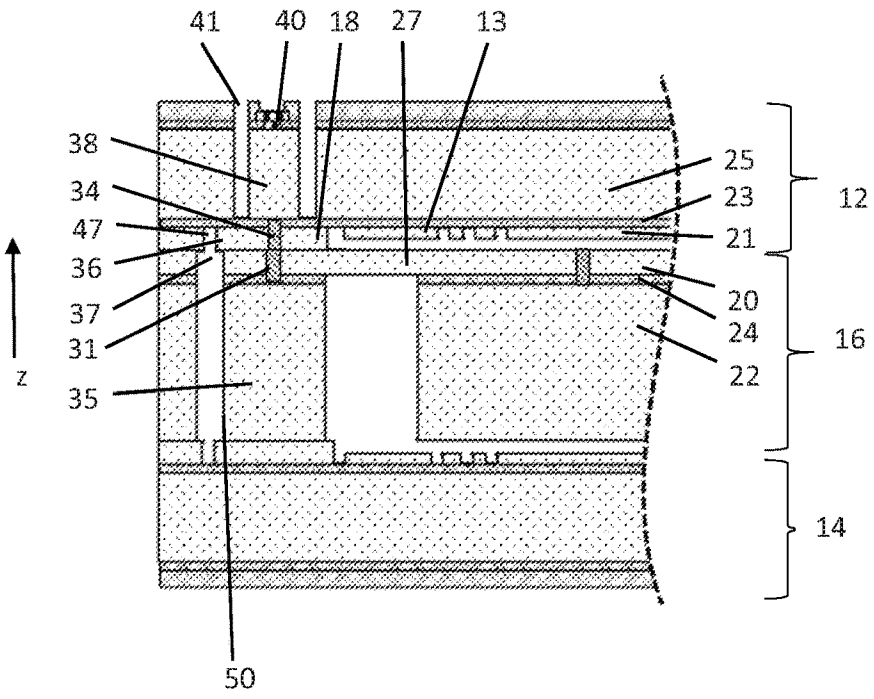

Still referring to FIGS. 1 and 2, but also to FIG. 2A, at least one electrically conductive path 70 extends through the top cap handle layer 25 and through the top cap device layer 21 of the SOI top cap wafer 12. In other embodiments, a similar electrically conductive path can also or alternatively be formed in the bottom cap wafer 14. The electrically conductive path 70 establishes an electrical connection between one of the electrical contacts 40 and the MEMS structure 17. The electrically conductive path 70 typically comprises a conducting shunt 34 formed through the top cap insulating layer 23, to electrically connect the top cap handle layer 25 and the top cap device layer 21. Preferably, the electrically conductive path 70 includes a post 38 formed in the top cap handle layer 25. The post 38 is delineated by a closed-loop trench 41 patterned through the entire thickness of the cap handle layer 25, as best shown in FIG. 1. The electrical contact 40 is located on the outer side of the post 38, i.e. on top of the post 38 and facing away from the MEMS wafer 16. The post 38, made of conductive silicon, is insulated from the remainder of the cap wafer 12 by the trench 41. Advantageously, the trench 41 surrounding the post 38 can be left unfilled, or empty, since the insulating layer 23 and the device layer 25 close the cavity 11 at the interface of the cap wafer 12 and of the MEMS wafer 16. The electrically conductive path 70 can also include a pad 36 formed in the top cap device layer 21. The pad 36 is also delineated by a trench 47 patterned in the top cap device layer 21, through the entire thickness of the top cap device layer 21, the trench 47 terminating at the top cap insulating layer 23. The pad 36 is aligned with the post 38, and the pad 36 preferably has a different cross-section (or transverse area in a plane perpendicular to the stacking axis Z) relative to that of the post 38, such that a thickness of silicon from the top cap device layer 21 faces the trench 41 delimiting the post 38, and similarly, a thickness of silicon from the top cap handle layer 25 faces the trench 47 delimiting the pad 36. This sizing of the pads and posts is advantageous, as it limits potential vertical leakage paths in the top cap 12 (i.e., leakage paths along the stacking axis Z). The electrically conductive path 70 may also comprise a portion formed as a pad 37 of silicon in the MEMS device layer 20. This pad of silicon is delineated by a trench 50, and is formed in at least the MEMS device layer 20. The pad 37 is electrically connected to the MEMS structure 17, and is aligned with the pad 36 formed in the top cap device layer 21. In this example shown in FIGS. 1, 2 and 2A, the electrically conductive path 70 connects the electrical contact 40 to the suspended proof mass 174 via one of the springs 27.

In some implementations, forming the caps 12, 14 from SOI wafers is advantageous because the thickness of the cap device layers 21, 26, typically made of SCS, is well-controlled and separated from the cap handle layers 25, 29 by a robust thermal oxide insulating layer 23, 28. Portions of the electrically conductive paths extending in the device 10 are preferably patterned as posts, with the posts having different cross-sections (or transverse areas) in the caps and MEMS wafers, so as to provide at least one layer of silicon, in addition to the cap insulating layer (buried oxide), opposite the trenches. The use of feedthrough posts allows the SOI caps to be thicker than caps using TSVs, thus minimizing pressure sensitivity and potential leaks to/from the cavity 11. It will be noted that, in alternate embodiments, the caps 12, 14 can be constructed using standard silicon wafers with the insulating 23, 24 layers being deposited using thin film deposition techniques such as furnace oxidation or LPCVD (Low Pressure Chemical Vapor Deposition) oxide, and the conducting or electrode layers 21, 26 deposited using LPCVD polysilicon, or sputter deposited or evaporated metals. The choice of approach and materials will be determined by subsequent processing temperatures, particularly wafer bonding temperatures.

Referring now to FIGS. 1, 2 and 2B, the 3D MEMS device 10 also comprises additional electrically conductive paths, such as path 72, extending through the top cap handle layer 25 and the top cap device layer 21, to establish electrical connections between a subset of the electrical contacts 40 and the cap electrodes 13 or 15. In other words, the additional electrically conductive paths provide connections between outer electrical contacts located on the top cap 12, and electrodes patterned in the caps or MEMS wafers. As best shown in FIG. 1, on the bottom cap wafer 14, the cap device layer may have leads 18 patterned therein, electrically connected to the cap electrodes 13 or 15. The leads 18 extend orthogonally to the stacking axis Z and may form part of some of the additional electrically conducting paths. A lead 18 is typically patterned in the device layer 21, 26 of the top 12 or bottom 14 cap wafers, by etching a trench which delineates it and isolate it from other regions of the wafer. The top and bottom cap electrodes 13, 15 are patterned in the device layer 21, 26 of the top 12 and bottom 14 SOI cap wafers, respectively. Some of the electrodes 13, 15 have leads 18 that are fabricated or patterned in the cap device layers 21, 26. Signals from/to the electrodes 13, 15 can be routed/transmitted via the leads 18 to electrical feedthrough 32 at the periphery of the device, in the top cap wafer 12. While a lead extends "horizontally" or orthogonally to the stacking axis Z, a feedthrough extends "vertically" or parallel to the stacking axis Z. The leads and feedthroughs, when electrically connected, can form portions of the electrically conductive paths 70 or 72. The additional electrically conductive paths extend from some of the outer electrical contacts 40 to the electrodes 13 or 15, and through at least the cap handle layer 25, and device layers 21. The top cap electrodes 13 feed directly through the leads 18 in the top cap SCS device layer 21 to the feedthroughs 32 (see, e.g., FIG. 2A). The bottom cap electrodes 15 are fed horizontally through the leads 18 in the bottom cap SCS device layer 26 then vertically, along the stacking axis Z, through MEMS vias 33 and up to the cap feedthroughs 32 (see, e.g., FIG. 2B).

Referring to FIGS. 2 and 2B, and in particular to the electrically conductive path 72, a portion 33 of the path extends in the MEMS wafer 16. This portion 33 can be referred to as a MEMS via or feedthrough. This portion 33 of the path 72 includes a post 35 etched into the handle layer 22 of the MEMS wafer 16 and a pad 37 etched into the MEMS device layer 20, connected through the buried oxide 24 by a conducting shunt 31. Another portion of the electrically conductive path 72 extends in the cap wafer 12. This portion 32 can be referred to as a cap via or feedthrough. The cap feedthrough 32 includes a pad 36 etched in the top cap device layer 21 and a post 38 etched in the top cap handle layer 25 that are electrically connected through the top cap buried oxide 23 by a conducting shunt 34. An electrical contact 40, such as a bond pad, may be formed on top of each cap feedthrough 32 to enable wire bonding or flip chip bonding to an integrated circuit (IC). Electrical connections between the bottom cap leads 18 and the MEMS vias 33 and between the MEMS vias 33 and the top cap pads 36 are established upon bonding the cap wafers 12, 14 to the MEMS wafer 16, for example by fusion bonding or another process.

As can be appreciated, in addition to forming electrical pathways, a hermetic seal is provided with no vertical leakage path formed between the cavity 11 housing the MEMS structure 17 and the outer surfaces of the top and bottom cap wafers 12, 14. Furthermore, since the trenches 41 in the handle layer 21 of the top cap 12 do not have to be filled, the top cap 12 can be made thicker, such as between 100 and 800 μm, and preferably thicker than 200 μm, and thus they are less sensitive to flexing caused by external pressure, in turn enabling the sense capacitors to also be insensitive or less sensitive to external pressure. Also, since the etched trenches 41 terminate on the top cap insulating layer 23, over a pad 36 in the cap device layer, and over a solid post 35 of silicon patterned in the MEMS wafer 16, the seal of the cavity 11 is more resistant. For a leak to occur through the cap, the SOI bond would have to be broken for there to be any leakage path, which would only be lateral, i.e., in the plane of the SOI bond, along the interface. The likelihood of such a leakage mechanism is typically much smaller because the SOI bond is stronger than the bond between deposited films used in through-silicon-vias (TSVs) and the lateral leakage path from outside to inside would typically be much longer and more indirect.

Figure 3A:
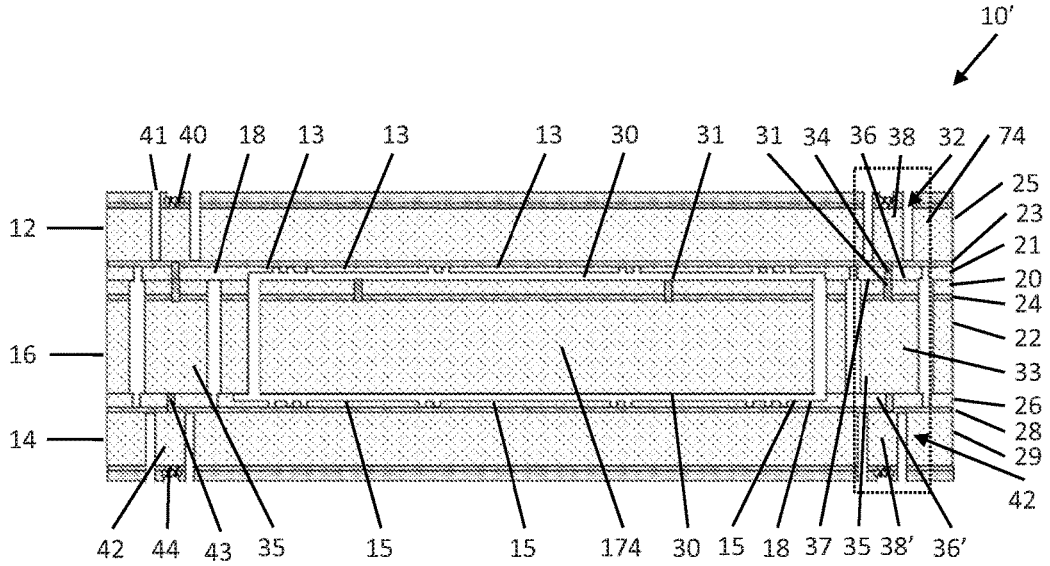
FIGS. 3A and 3B are cross section views of other possible embodiments of a 3D MEMS device.

Referring now to FIG. 3A, another possible embodiment of a 3D MEMS device 10' is shown in cross-section. In this case the MEMS device 10' is a MEMS 3D inertial sensor fabricated with silicon-on-insulator (SOI) top and bottom cap and MEMS wafers with electrical connections on both top and bottom cap wafers and 3D electrical pathways between the cap wafers. This embodiment allows electrical input and output signals to be directed toward either one of the top and bottom cap 12, 14, thereby enabling chip stacking and direct bonding of the device 10' to a printed circuit board (PCB).

More specifically, the bottom cap wafer 14 is formed of a device layer 26, an insulating layer 28 and a handle layer 29, the device and handle layers 26, 29 being made of silicon. Both the top and bottom caps 12, 14 are provided with outer electrical contacts 40, 44, and device feedthroughs 74 can be formed with a top cap feedthrough 32, a MEMS feedthrough 33, and a bottom cap feedthrough 42, providing electrical conductivity between outer electrical contacts 40, 44 formed on opposite outer top and bottom sides of the device 10. The top cap feedthrough 32 includes a cap feedthrough post 38, a cap feedthrough pad 36 and a cap conductive shunt 34 formed through the top cap insulating layer 23, to electrically connect the cap feedthrough post 38 with the cap feedthrough pad 36. The post 38 is provided with a bond pad 40. The MEMS feedthrough 33 includes a MEMS feedthrough post 35 patterned through the entire thickness of the MEMS handle layer 22, a MEMS feedthrough pad 37 patterned through the entire thickness of the MEMS device layer 20, and a MEMS conductive shunt 31 formed through the MEMS insulating layer 24, to electrically connect the MEMS feedthrough post 35 and the MEMS feedthrough pad 37. In a manner similar to that used for the top cap 12, a bottom cap feedthrough 42 is also formed by etching of a cap feedthrough post 38' in the bottom cap handle layer 29, and a cap feedthrough pad 36' in the device layer 26, with conducting shunts 43 used to connect the post and pad 38', 36' through the buried oxide 28. The SOI MEMS wafer 16 is bonded to the SOI cap wafers 12, 14 with conductive bonds, and thus there is an electrical pathway from the electrical outer contact 40 of the top cap 12 to the outer electrical contact 44 of the bottom cap 14. The device feedthrough 74 can be used to transmit signals through all three SOI layers of the MEMS device 10'.

Of course, electrical paths may also extend from the outer electrical contacts 44 of the bottom cap 14, through bottom cap posts 38', and then to pads 36' and leads 18' in the bottom cap SCS layer 26. Thus, electrical paths can be established from the top or bottom cap electrodes 13, 15 to bond pads 40, 44 on either or both of the top cap 12 and bottom cap 14. It will be noted that for embodiments of the device 10 for which the bottom cap wafer 14 is not provided with any electrical contact, a "device feedthrough" may only comprise a top cap feedthrough 32 formed in the cap wafer 12, and a MEMS feedthrough 33 formed in the MEMS wafer 16, with electrical conductivity existing from an outer electrical contact 40 to the MEMS feedthrough 33.

Figure 3B:
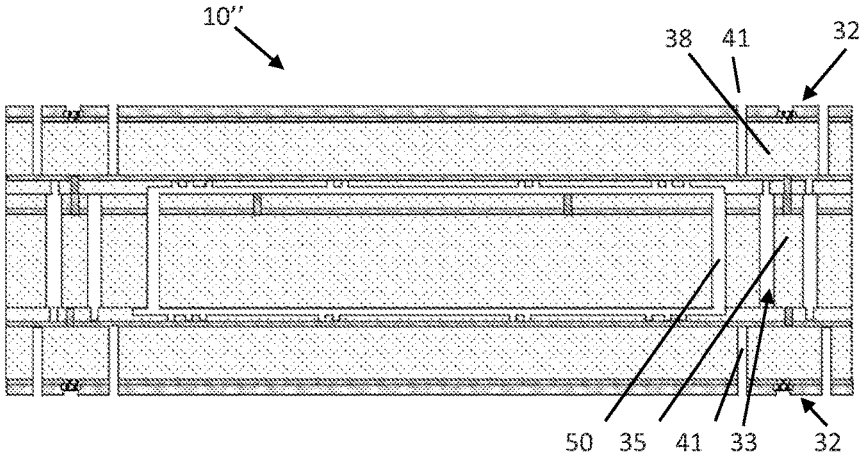

Still referring to FIG. 3A, and also to FIG. 3B, the cap feedthroughs 32 and the MEMS via 33 are preferably configured such that either: (i) the cap feedthrough 32 and its surrounding etched trench 41 have a smaller cross-section than and are positioned within the area of the silicon post or column 35 of the MEMS via 33, as shown in FIG. 3A; or (ii) the MEMS via 33 and its surrounding trench 50 have a smaller cross-section than and are positioned within the area of the silicon column 38 of the cap feedthrough 32, as shown in the MEMS device 10" of FIG. 3B. As mentioned above, in addition to forming electrical pathways, a hermetic vacuum seal is provided with no vertical leakage path. Indeed, in the illustrated embodiment, nowhere between the top to the bottom bond pads 40, 44 is there a vertical pathway that does not have silicon therealong. Furthermore since the trenches 41 do not have to be filled, both the top and bottom caps 12,14 can be thicker (e.g. 100-800 micrometers, and preferably between 200-800 um) and less sensitive to flexing due to external pressure, enabling the sense capacitors to be insensitive or less sensitive to external pressure.

Method of Fabricating the 3D MEMS Device

In accordance with another aspect, there is provided a method of fabricating a hermetic MEMS sensor and package. An exemplary embodiment of the fabrication method will be described with reference to the schematic diagrams of FIGS. 4A to 6F. Of course, it will be understood that there is no intent to limit the fabrication method to the embodiment described. It will also be understood that, while in the illustrated embodiment the fabrication method is, by way of example, performed to fabricate a MEMS inertial sensor like that described above with reference to FIG. 3A, it could also be used to fabricate any other suitable MEMS device.

Figure 4A:
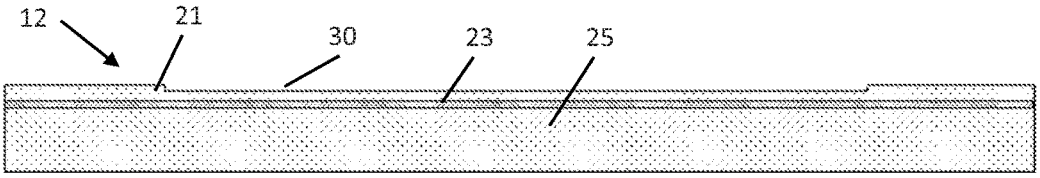
FIG. 4A is a cross section view of a top cap wafer of the 3D MEMS device of FIG. 3A, showing the patterning of a sense and drive capacitor gap.

Referring to FIG. 4A, the process starts with an SOI (Silicon on Insulator) wafer 12 consisting of a SOI device layer 21, a SOI handle layer 25, and buried oxide 23. Capacitor gaps 30 are patterned in the SCS device layer 21. The gaps are typically 1-5 micrometer deep and can be fabricated by wet or dry etching or by other processes such as patterned local oxidation of silicon (LOCOS) and oxide removal.

Figure 4B:
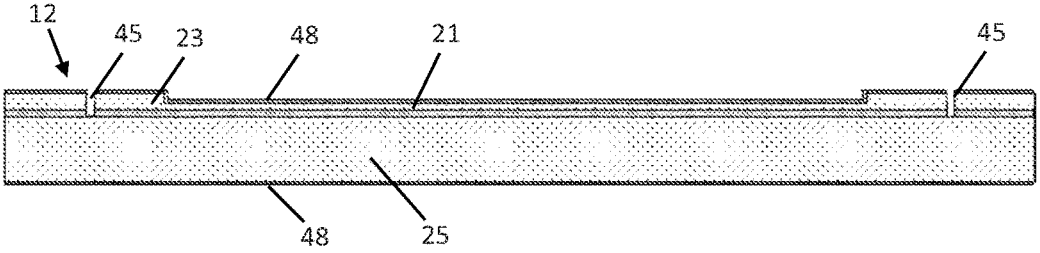
FIG. 4B is a cross section view of the top cap wafer of FIG. 3A, showing the deposition of a protective oxide film and etching of trenches for the conductive shunts.

Referring to FIG. 4B, the SOI wafer 12 is oxidized to form a protective layer 48 on the top and bottom surfaces thereof. Contact vias 45 are patterned in desired spots and etched through the SOI device layer 21 and buried oxide 23 to or slightly into the SOI handle layer 25.

Figure 4C:
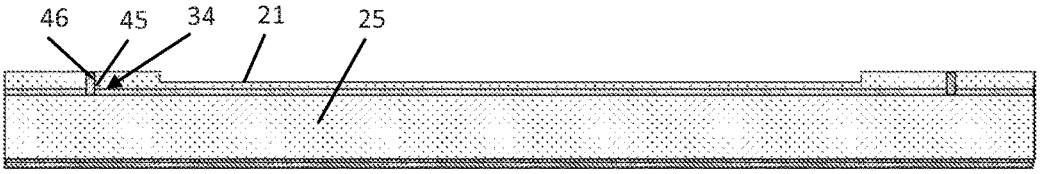
FIG. 4C is a cross section view of the top cap wafer of FIG. 3A, showing the conducting shunt trenches filled with a conducting film (e.g., polysilicon), and removal of the excess conducting film and protective oxide from the inner side of the top cap wafer.

Referring to FIG. 4C, the contact vias 45 are then filled with a conducting material 46, which can be doped polycrystalline silicon (polysilicon), metal, or other conducting material, and polished or etched back flush or just below the surface of the wafer. In this way, an electrical path is formed through the shunt 34, vertically (or parallel to the stacking axis) between the SOI device and handle layers 21, 25 at predetermined locations.

Figure 4D:
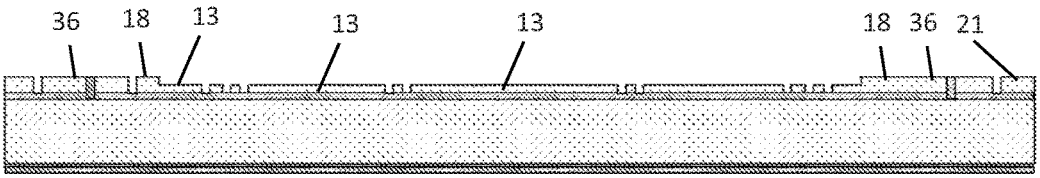
FIG. 4D is a cross section view of the top cap wafer of FIG. 3A, showing trench patterning to define electrodes and leads.

Referring to FIG. 4D, the electrodes 13, leads 18, and pads 36 are defined in the SCS device layer 21, for example using photolithography and dry etching stopping on the buried oxide 23. The bottom cap wafer (see FIG. 6C) can be similarly patterned with gaps and electrodes. Conductive shunts are included in the bottom cap wafer if the embodiment of FIG. 3A (or another similar embodiment) with top and bottom feedthroughs is being fabricated. Alternatively, conductive shunts are omitted from the bottom cap 14 if the embodiment of FIG. 1 (or another similar embodiment) with no bottom cap feedthroughs is being fabricated.

Figure 5A:
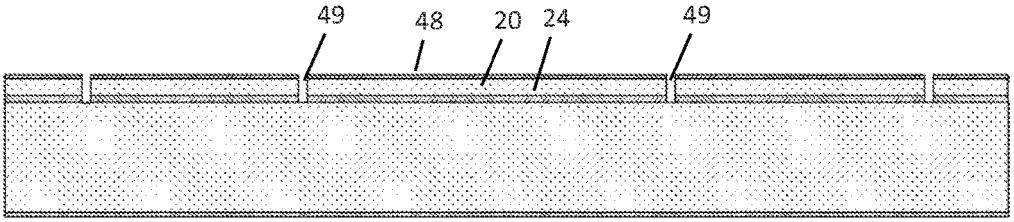
FIG. 5A is a cross section view of a MEMS wafer of the 3D MEMS device of FIG. 3A, showing the etching of trenches for the conductive shunts.
Figure 5B:
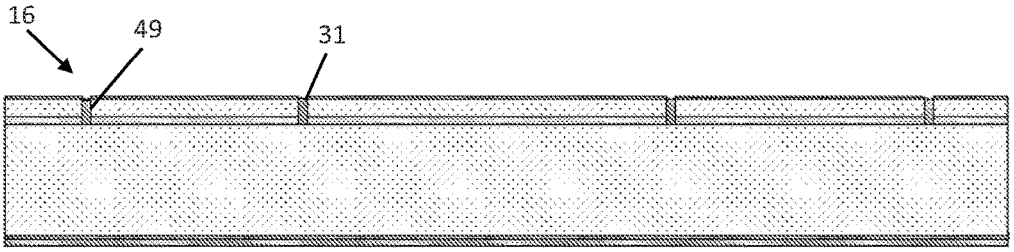
FIG. 5B is a cross section view of the MEMS wafer of FIG. 3A, showing the conductive shunt trenches filled with a conducting film (e.g., polysilicon) and removal of the excess conducting film from the front of the MEMS wafer.
Figure 5C:
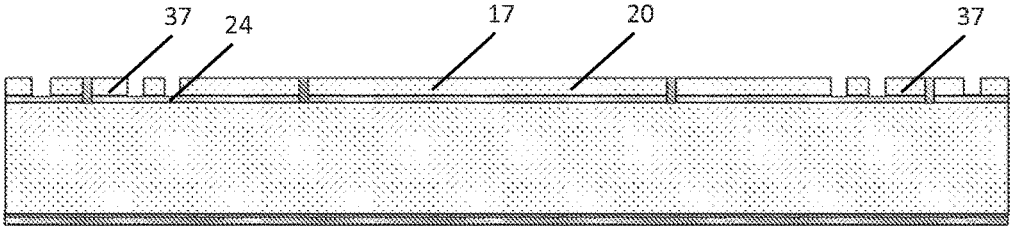
FIG. 5C is a cross section view of the MEMS wafer of FIG. 3A, showing the protective oxide film etched off of the surface of the MEMS wafer and patterning of the MEMS structure.

FIGS. 5A to 5C illustrate the fabrication of the MEMS wafer 16, which can be performed much as depicted in FIGS. 4B through 4D for the caps. Referring to FIG. 5A, a thin protective oxide 48 is deposited on the device layer side of the SOI wafer 16 and vias 49 for the conductive shunts are etched into the MEMS SCS device layer 20 and through the buried oxide layer 24.

Referring to FIG. 5B, the vias 49 are filled with a conductor such as doped polysilicon or metal and then polished or etched back flush or just below the surface of the MEMS wafer 16 to form the conducting shunts 31.

Referring to FIG. 5C, the polysilicon or other conductor and protective oxide are etched off the SOI device layer 20. MEMS structures such as the top portion of the proof mass 17, springs (not visible), and feedthrough pads 37 are defined in the SCS device layer 20 using, for example, photolithography and dry etching stopping on the buried oxide 24.

Figure 6A:
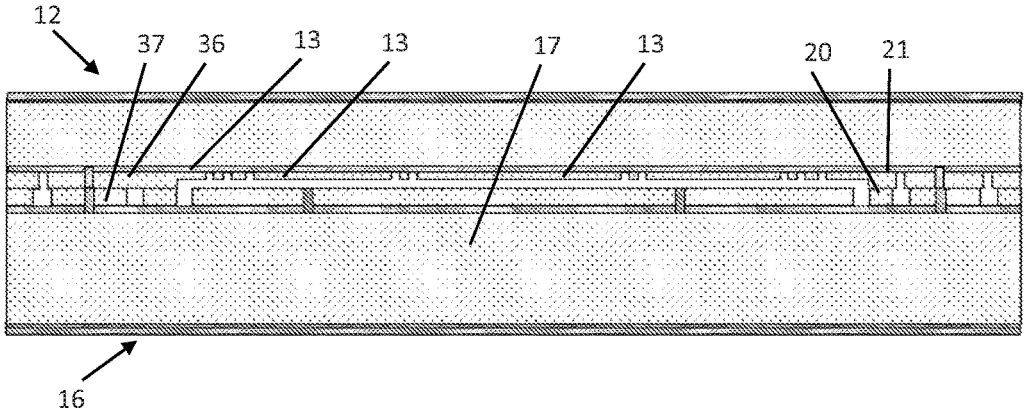
FIG. 6A is a cross section view showing the top cap wafer of FIG. 3A aligned and bonded to the patterned side of the MEMS wafer of FIG. 3A.

Referring to FIG. 6A, the SCS device layer 21 of the top cap wafer 12 is then aligned and bonded to the SCS device layer 20 of the MEMS wafer 16. The feedthrough pads 36 on the top cap SCS layer 21 are aligned with the corresponding pads 37 on the SCS layer 20 of the MEMS wafer 16 and the electrodes 13 on the top cap 12 are aligned with the relevant portion of the proof mass 174 on the MEMS wafer 16. The wafer bonding process used should preferably be one that provides a conductive bond such as, for example, fusion bonding, gold thermocompression bonding, or gold-silicon eutectic bonding.

Figure 6B:
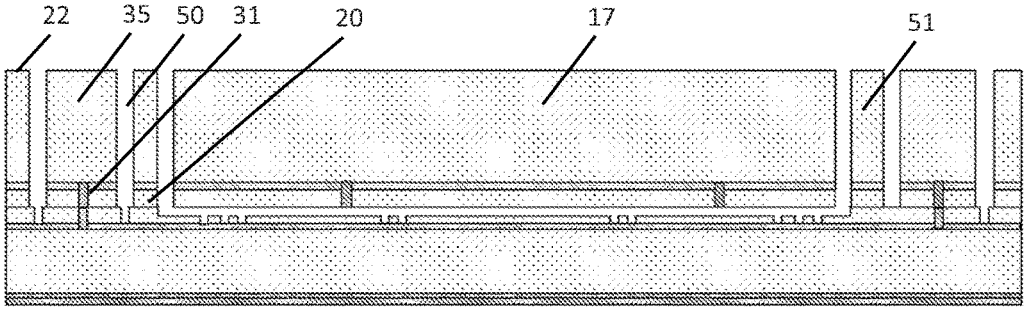
FIG. 6B is a cross section view of the assembled top cap and MEMS wafers of FIG. 6A, showing the conducting and insulating films etched off the other, non-processed side of the MEMS wafer and the MEMS handle layer patterned.

Referring to FIG. 6B, the conducting polysilicon and protective thermal oxide are etched off of the backside of the MEMS handle layer 22. The MEMS handle layer 22 is next patterned to form the proof mass 174 and feedthroughs 35. Trenches 50 are then etched around each feedthrough post 35 to isolate it from the rest of the layer 22. If the feedthrough is electrically connected to a conductive shunt 31 on the SCS device layer 20, then it becomes an isolated electrical feedthrough. However, if the feedthrough is not attached to a conducting shunt the feedthrough becomes merely a mechanical support 51.

Figure 6C:
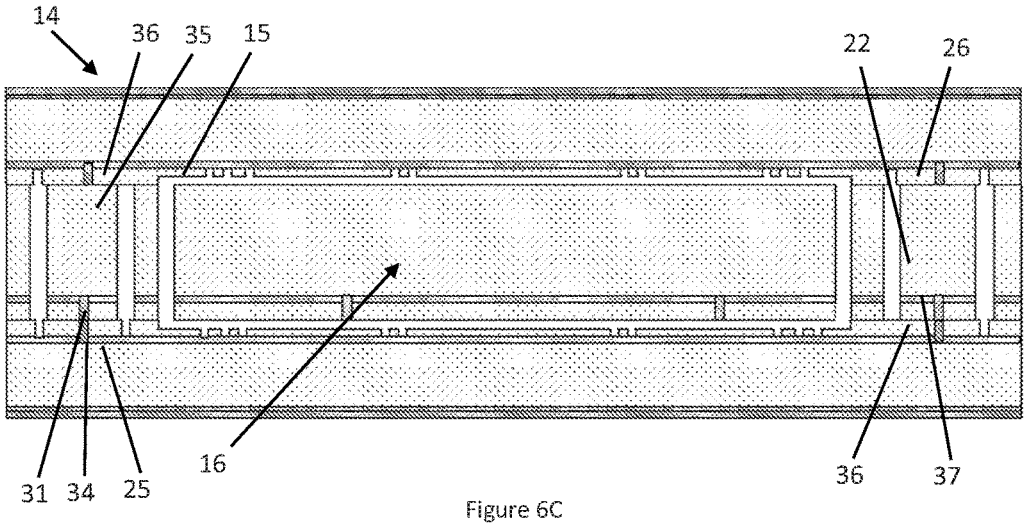
FIG. 6C is a cross section view of the 3D MEMS device of FIG. 3A, showing the bottom cap wafer bonded to the MEMS wafer.

Referring to FIG. 6C, the SCS device layer 26 of the bottom cap wafer 14 is next bonded to the handle layer 22 of the MEMS wafer 16. Again a wafer bonding method such as fusion bonding, gold thermocompression bonding, or gold-silicon eutectic bonding can be used to provide electrical contact between the feedthroughs 35 in the MEMS wafer 16 and the pads 36 on the bottom cap wafer 14 which are connected electrically to the bottom electrodes 15. In this manner a conductive path is provided from the bottom electrodes 15 and successively through the bottom cap pads 36, the MEMS handle feedthroughs 35, the conductive shunts 31, the MEMS SCS pads 37, the top cap pads 36, and the top cap conductive shunts 34, up to the top cap handle layer 25. At this point the MEMS wafer 16 is hermetically sealed between and aligned with the cap wafers 12, 14. Also, the electrodes on each cap are shorted together through their leads 18 and shunts 34 to the cap handle 25.

Figure 6D:
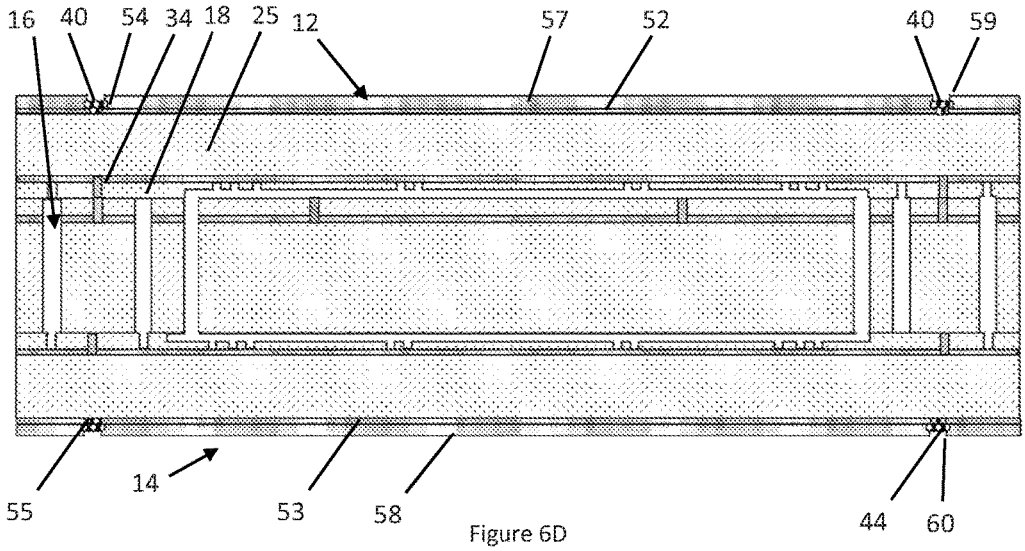
FIG. 6D is a cross section view of the 3D MEMS device FIG. 3A, showing the caps ground and polished to thin them, coated with insulated oxide layers, contacts opened in the oxide layers, bond pads deposited and patterned, thick protective oxide films deposited, and contacts opened over the bond pads in the protective oxide.

Referring to FIG. 6D, the cap wafers 12, 14 are next ground and polished to the desired thickness. Insulating oxide layers 52, 53 are deposited on each cap wafer, contacts 54, 55 are etched in the oxide, and bond pad metallization 40, 44 is deposited and patterned. The bond pad metallization 40, 44 is passivated by a thicker protective oxide layer 57, 58, and contacts 59, 60 to the bond pads 40, 44 are opened in the protective oxide.

Figure 6E:
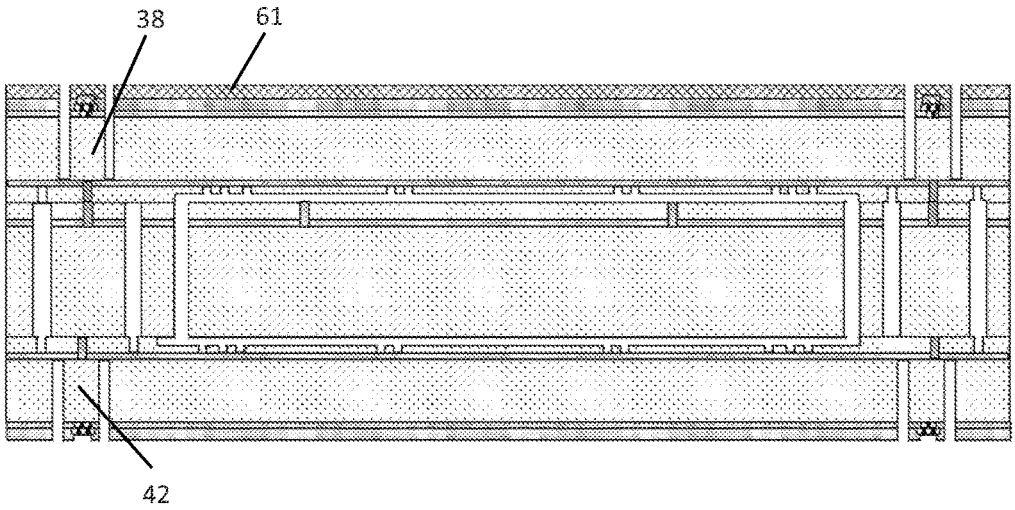
FIG. 6E is a cross section view of the 3D MEMS device of FIG. 3A, showing feedthroughs etched in the top and bottom cap handle layers with a photoresist pattern still in place on the top cap wafer.

Referring to FIG. 6E, feedthroughs 38, 42 are etched into the caps using a photoresist mask 61 to protect the bond pads.

Figure 6F:
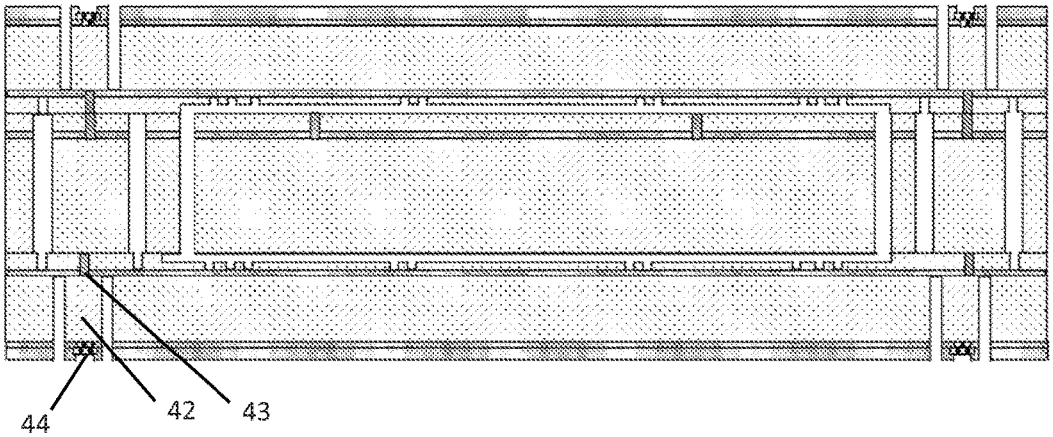
FIG. 6F is a cross section view of the 3D MEMS device of FIG. 3A, showing the completed 3D MEMS device with the photoresist mask removed, the 3D MEMS device forming an inertial sensor in this embodiment.

Finally, referring to FIG. 6F, the photoresist is stripped and the bonded wafer stack is now ready for dicing or wafer bonding to an IC wafer. If bottom bond pads are not required, the bottom cap conducting shunts 43, feedthroughs 42, and bond pads 44 can be omitted.

Embodiments of 3D MEMS Device Including Cavities at Different Pressures

In accordance with another embodiment of the invention, a multi-pressure, multi-chamber (or multi-cavities) 3D MEMS device 100 is provided. The exemplary device 100 described below and illustrated in the FIGS. 7 to 10 is a two-chamber, two-mass inertial sensor since it is representative of mechanical, electrical, and vacuum requirements or characteristics that are generally desired in common practical implementations of MEMS devices. However, the packaging approach described herein is of more general applicability to other types of MEMS sensors and devices with these requirements or characteristics and could include pressure sensors, magnetometers, microphones, ultrasonic transducers, and the like.

The embodiment of the 3D MEMS device shown in FIGS. 7 to 10 has a similar architecture to that of the ones shown in the previous FIGS. 1, 2, 3A and 3B, in that it comprises a central MEMS wafer having a MEMS structure patterned therein, top and bottom SOI cap wafers bonded on each side of the MEMS wafers, the three layers of wafers defining at least one hermetically sealed cavity or chamber. The 3D MEMS device 100 has a second, additional cavity, housing a second MEMS structure, wherein this second, additional cavity is at a different internal pressure that the first, hermetically sealed cavity. Yet in other embodiments, the 3D MEMS device according to the present invention can comprise more than one hermetically sealed cavity, and more than one cavity at the same or at different internal pressures, each including a respective MEMS structure.

Figure 7:
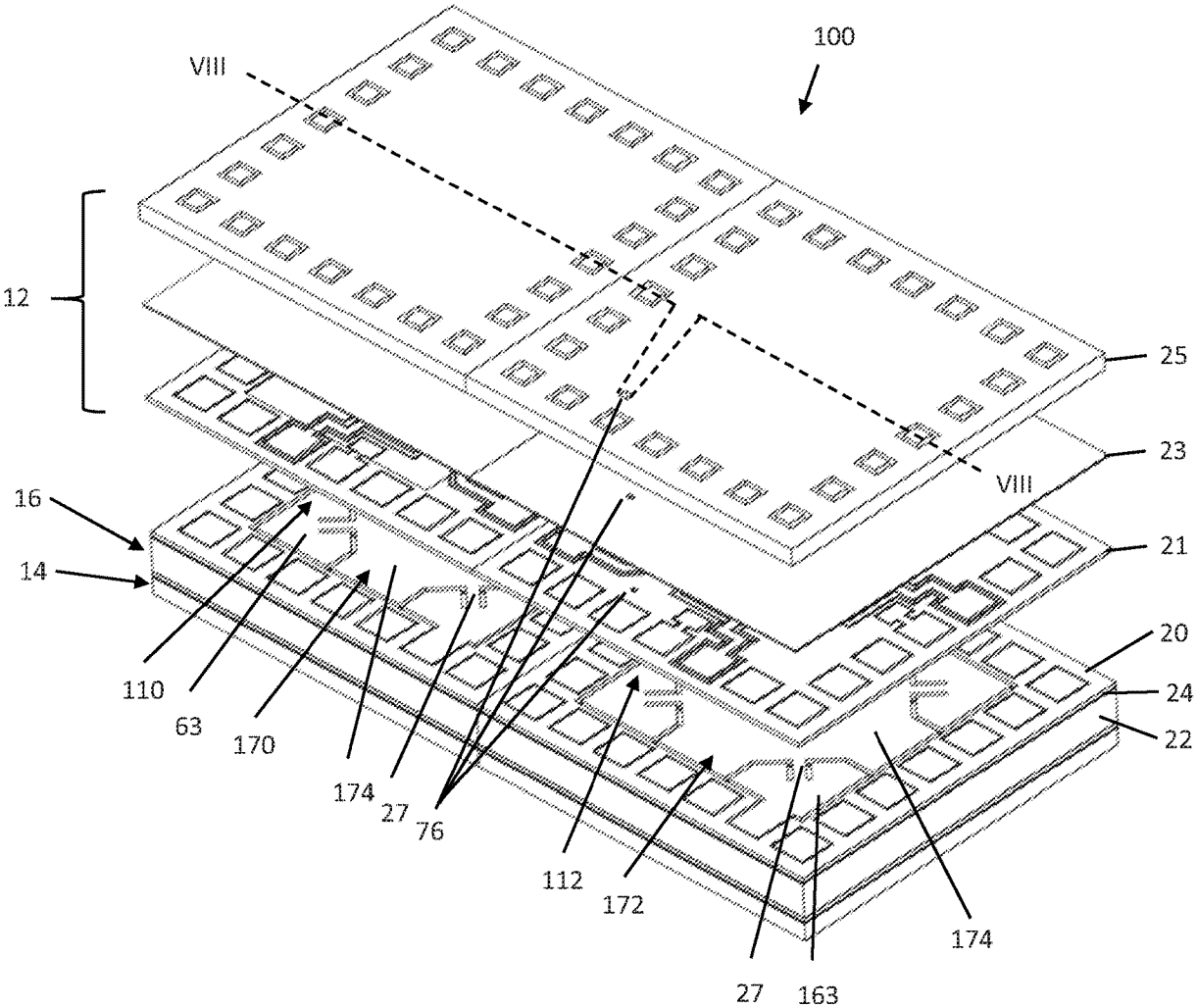
FIG. 7 is a schematic partially exploded isometric view of a 3D MEMS device including two cavities, in accordance with a possible embodiment.
Figure 8:
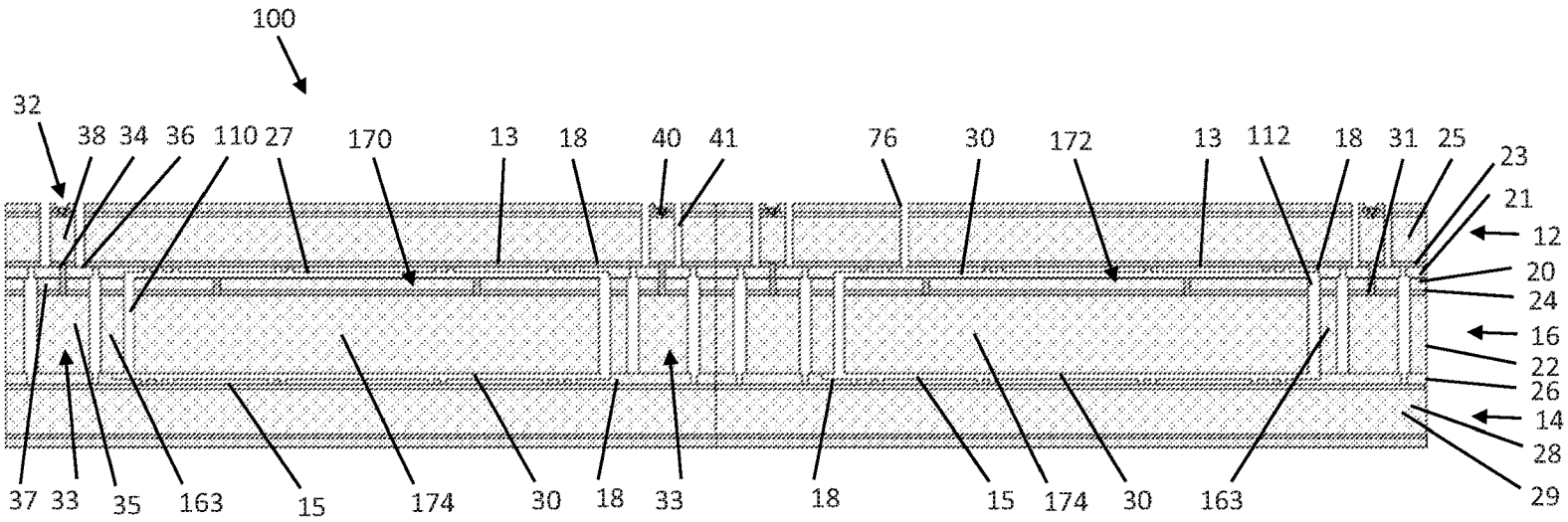
FIG. 8 is a cross-sectional view of the 3D MEMS device of FIG. 7, taken along section line VIII-VIII.
Figure 9:
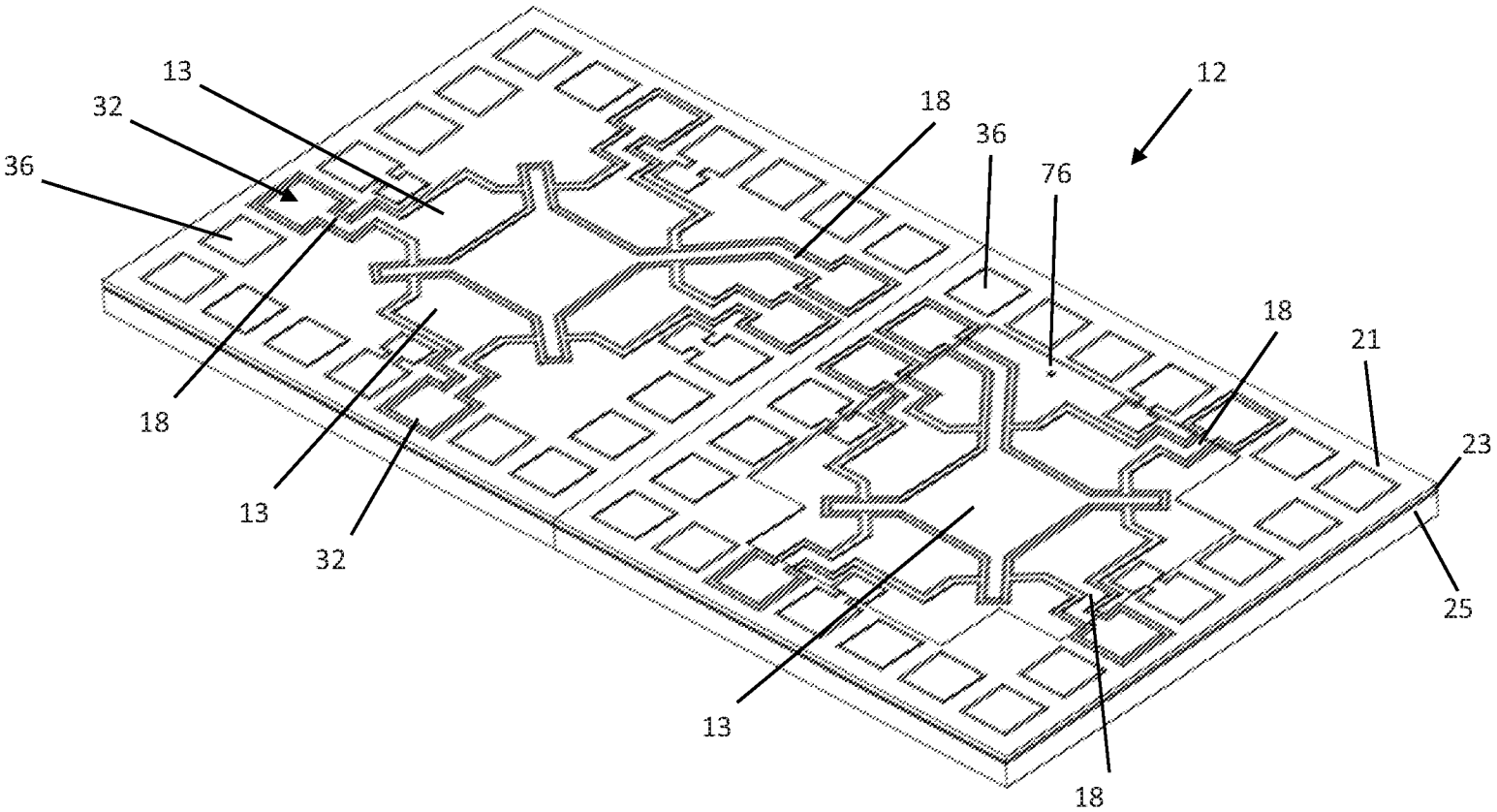
FIG. 9 is an isometric view of the underside of the top cap wafer of the 3D MEMS device of FIG. 7.

FIG. 7 shows an exploded isometric view of an embodiment of a 3D MEMS device 100 with two cavities 110, 112, (or chambers) fabricated using techniques described above. FIG. 8 shows a cross-sectional view of FIG. 7 along line VIII-VIII. The cross-section line detours toward the edge of the device 100 to illustrate the cross-section of a vent 76. FIG. 9 is an isometric view of the underside of the top cap 12.

Referring to FIGS. 7, 8 and 9, the MEMS device 100 consists of a first chamber 110 and second chamber 112 enclosing first and second MEMS elements or structures 170 and 172 respectively. The first chamber 100 is hermetically sealed at a first pressure. The second chamber 112 is open to a second external pressure through a vent 76. In other words, the vent 76 establishes a gas communication pathway along which gas such as air may move or be exchanged between the second chamber 112 and the environment outside the device 100. Due to the provision of the vent 76, the pressure inside the second chamber 112 corresponds to the ambient pressure of the environment of the device 100.

Figure 10:
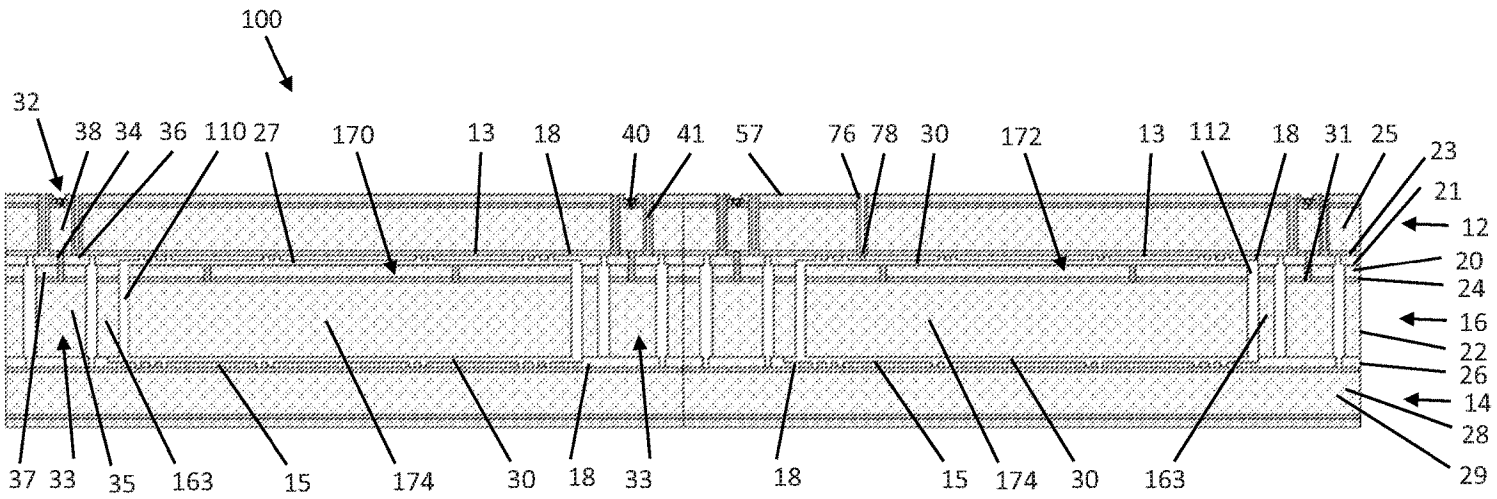
FIG. 10 is a cross-sectional view of another possible embodiment of a 3D MEMS device provided with two cavities, wherein a plug is provided to maintain one of the cavities at a pressure different from the ambient pressure of the environment in which the device is provided.

FIG. 10 illustrates an alternate embodiment 100' in which the vent 76 has been sealed with a plug 78 or another suitable sealing element to maintain the second chamber 112 at a second pressure. Referring to FIGS. 7 to 10, the MEMS structures 170 and 172 are fabricated in a MEMS wafer 16 which is located between and bonded to a top cap wafer 12 and a bottom cap wafer 14.

In the illustrated embodiments, the MEMS structures 170, 172 enclosed in the cavities 110, 112 are part of a gyroscope and of an accelerometer, respectively. These illustrative embodiments are chosen because a MEMS gyroscope is a resonant device which typically requires a low pressure or vacuum environment, while a MEMS accelerometer typically requires mechanical damping that in many implementations, is provided by fluid or air damping. In the illustrated embodiments, the MEMS wafer 16 in which the gyroscope and accelerometer elements 170, 172 are fabricated is a silicon-on-insulator (SOI) wafer including a single crystal silicon (SCS) device layer 20, a handle layer 22, and an insulating layer 24 (e.g., buried oxide) sandwiched between the device layer 20 and the handle layer 22. Although the details of the MEMS elements 170, 172 are not critical to the packaging description, they are included for subsequent reference. Also, it is to be understood that, in other embodiments, the MEMS wafer 16 is not limited to the SOI technology but may be based on various other types of materials and structures.

In the embodiments of the 3D MEMS devices 100, 100' of FIGS. 7-9 and 10, each of the gyroscope and accelerometer comprises MEMS structures 170, 172. In these examples, the MEMS structures include including respective proof masses 174 suspended by springs 27 from support posts 163. The bulk of the proof mass 174 is in the handle layer 22 of the SOI wafer 16, and the springs 27 are patterned in the SCS device layer 20. Because the device and handle layers 20, 22 of the SOI wafer 16 are separated by an insulating buried oxide layer 24, conducting shunts 31 extending through the buried oxide 24 are used to electrically connect the device and handle layers 20, 22 where required or desired. The caps 12, 14 include one or more recesses formed in the inner side thereof (i.e., the side facing the MEMS wafer 16) which form a capacitor gap 30 between cap electrodes 13, 15 and the outer surfaces of the proof mass 174. As used herein, the term "capacitor gap" refers to the space between the outer surfaces of the MEMS structures 170, 172 and the inner surfaces of the caps 12, 14.

Referring to FIGS. 8 and 10, at least one (and preferably both) of the top 12 and bottom 14 caps are also SOI wafers. As explained previously, SOI is advantageous because the SCS device layers 21, 26 are electrically insulated from the SOI handle layers 25, 29 by the thermal oxide layers 23, 28.

Alternatively, the caps 12, 14 can be constructed using other materials such as standard silicon wafers with the insulating layers being deposited using thin film deposition techniques such as furnace oxidation or LPCVD (Low Pressure Chemical Vapor Deposition) oxide, and the conducting or electrode layers deposited using LPCVD polysilicon, or sputter deposited or evaporated metals. The choice of approach and materials will be determined by subsequent processing temperatures, particularly wafer bonding temperatures. In the illustrated embodiments, the top and bottom cap electrodes 13, 15 can be fabricated in the SCS device layers 21, 26 of the top 12 and bottom 14 SOI cap wafers, respectively. Also, the electrode 13, 15 can be provided with leads 18 fabricated in the cap SCS device layer 21, 26. The top cap electrodes 13 feed directly through the leads 18 in the top cap SCS device layer 21 to the feedthroughs 32. Meanwhile, the bottom cap electrodes 15 are fed horizontally through the leads 18 in the bottom cap SCS device layer 26, then vertically through MEMS feedthroughs 33 and up to the cap feedthroughs 32.

Referring still to FIGS. 8 and 10, the MEMS feedthrough 33 consists of a post 35 etched into the handle layer 22 of the MEMS wafer 16 and a pad 37 etched into the MEMS SCS device layer 20 connected through the buried oxide 24 by a conducting shunt 31. The feedthroughs 32 consists of a pad 36 etched in the top cap SCS device layer 21 and a post 38 etched in the top cap handle layer 25 that are electrically connected through the top cap buried oxide 23 by a conducting shunt 34. An electrical contact, such as a bond pad 40, may be attached to each feedthrough 32 to enable wire bonding or flip chip bonding to an integrated circuit (IC). Electrical connections between the bottom cap leads 18 and the MEMS vias 33 and between the MEMS vias 33 and the top cap pads 36 are established upon bonding the cap wafers 12, 14 to the MEMS wafer 16, for example by fusion bonding or another process.

In addition to forming electrical pathways, a hermetic vacuum seal is provided between each of the first and second chambers 110, 112 housing the proof masses 174 and the inner surfaces of the top and bottom cap wafers 12, 14. Referring to FIG. 8, the trenches 41 which define the top cap posts 38 are etched through the handle layer 25 and the buried oxide layer 23 and terminate on the SCS device layer 21, preserving the hermetic seal. However, in the second chamber 112, a vent 76 is provided in the SCS device layer 25, such that when the handle layer 25 and buried oxide layer 23 are etched, a pathway is opened between the second chamber 112 and the external environment. The embodiment of FIG. 8 allows the ambient atmosphere to enter the second cavity 112 to provide an air damping environment. Referring to FIG. 10, if a fixed pressure environment is desired, the vent 76 can be sealed by a plug 78 or a similar structure formed by depositing a final thin insulating film 57 on the outer side of the top cap 12. The pressure in the second cavity 112 will be defined by the ambient pressure in the system in which the insulator 57 is deposited. Of course, in other embodiments, the vent can be provided by the top cap or MEMS wafer.

Method of Fabricating a 3D MEMS Device with Cavities at Different Pressures

Figure 11A:
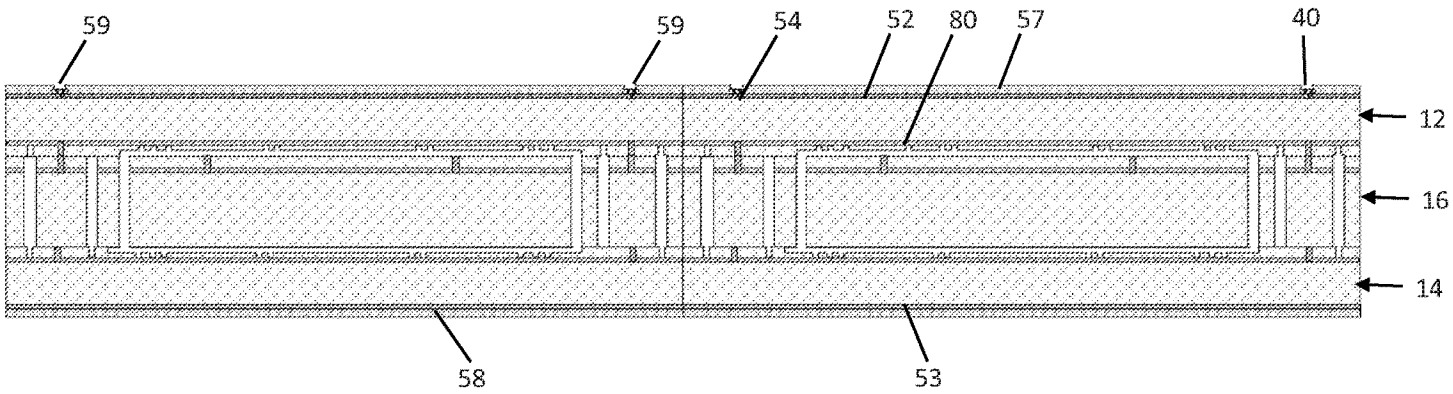
FIG. 11A is a cross-sectional view of a 3D MEMS device during the fabrication process, with the assembled top cap, bottom cap and MEMS wafers.

The first steps for the fabrication of a 3D MEMS device similar to the embodiments of FIGS. 7 to 10, including a hermetic cavity and including a second cavity at a different pressure, are similar to those described previously, for the embodiments shown in FIGS. 1, 2, 3A and 3B. Thus, only the steps relating to the fabrication of the vent 76 are described below. Referring to FIG. 11A, the bottom portion of the vent hole 80 is patterned in the SCS and buried oxide layers 21, 23 of the top cap wafer 12 at the same time as the leads and electrodes (refer to FIG. 4D). The process then proceeds as described earlier: patterning the inner side of the bottom cap wafer 14; patterning both sides MEMS wafer 16; and bonding the top and bottom cap wafers 12, 14 to the MEMS wafer 16 so as to provide electrical conductivity between these layers.

Referring still to FIG. 11A, after having ground and polished the cap wafers 12, 14 to the desired thickness, insulating oxide layers 52, 53 are deposited on each cap wafer. Contacts 54 are etched in the top cap oxide 52, and metal is deposited on the top cap 12 and patterned to form bond pads 40. The top cap bond pads 40 and bottom cap 16 are passivated by thicker protective oxide layers 57, 58. Contacts 59 to the top cap bond pads 40 are opened in the protective oxide 57.

Figure 11B:
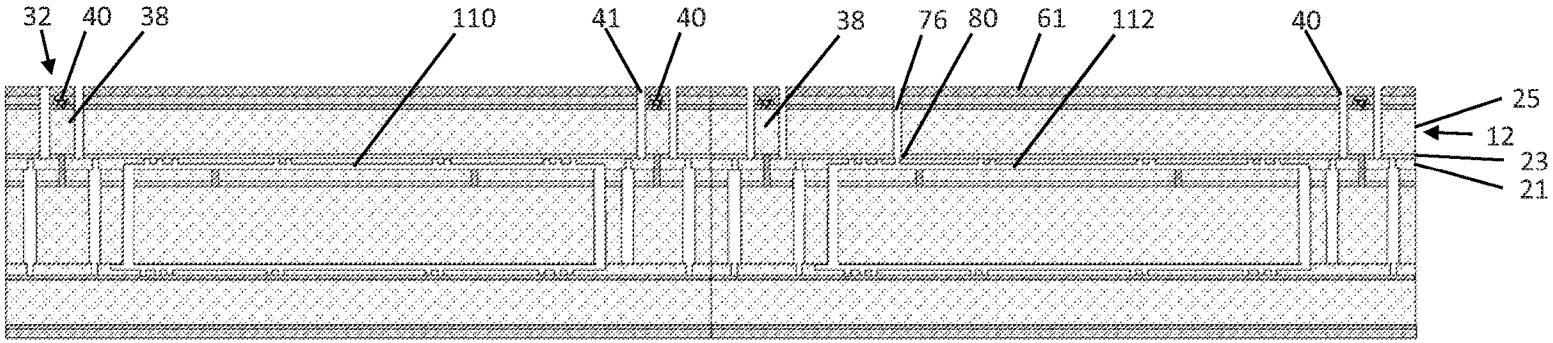
FIG. 11B is a cross-sectional view of the assembled top cap, bottom cap and MEMS wafers of FIG. 11A, after etching of feedthroughs and a vent in the top cap handle layer with the photoresist pattern still in place on the top cap. In this embodiment, the vent permits gas or air communication between a second chamber formed in the MEMS wafer and the outside of the 3D MEMS device.

Referring to FIG. 11B, the top cap 12 is coated with photoresist 61 to protect the bond pads 40 and to provide an etch mask for the posts 38 of the top cap feedthroughs 32. The posts 38 are patterned by etching into the cap 12 trenches 41 which go through the cap handle silicon layer 25 and buried oxide 23 and terminate on the SCS device layer 21. At the same time the portion of the vent 76 in the top cap handle is patterned and etched. The vent 76 is aligned with a hole 80 in the SCS device layer 20 of the top cap 12. When the handle layer 21 and buried oxide 22 of the MEMS wafer 16 are etched, a pathway is opened through the SCS hole 80 into the second chamber 112. Thus when the MEMS device 100 is exposed to atmosphere, the pressure in the second chamber 112 rises to atmospheric pressure, while the pressure in the hermetically sealed first chamber 110 stays the same (e.g., at vacuum).

Figure 11C:
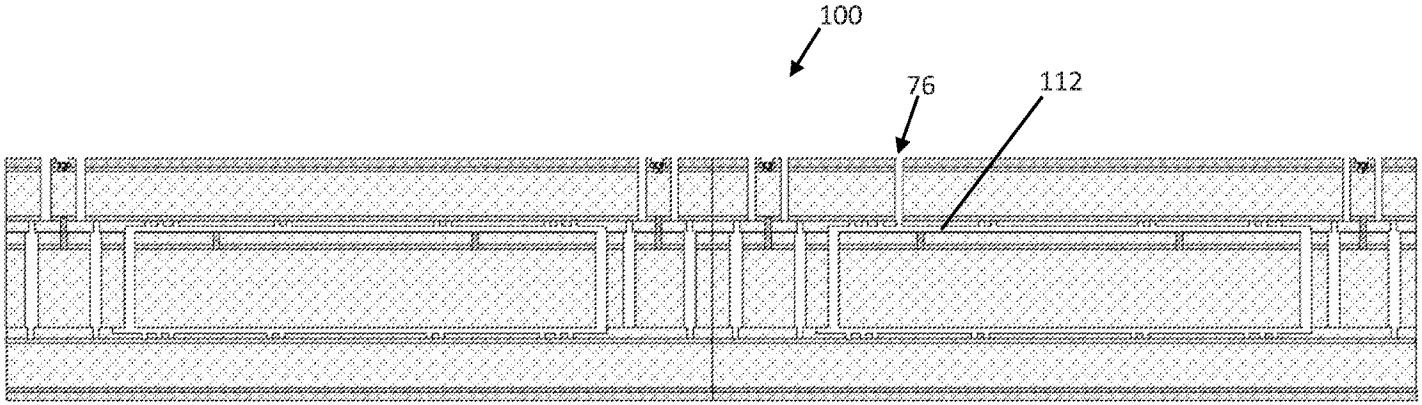
FIG. 11C is a cross-sectional view of a completed 3D MEMS device with two cavities at different pressures.

Referring to FIG. 11C, the photoresist is stripped, preferably with a dry strip, and the bonded wafer stack 100 is now ready for dicing or wafer bonding to an IC wafer. The second chamber 112 will remain exposed to the atmosphere.

Figure 11D:
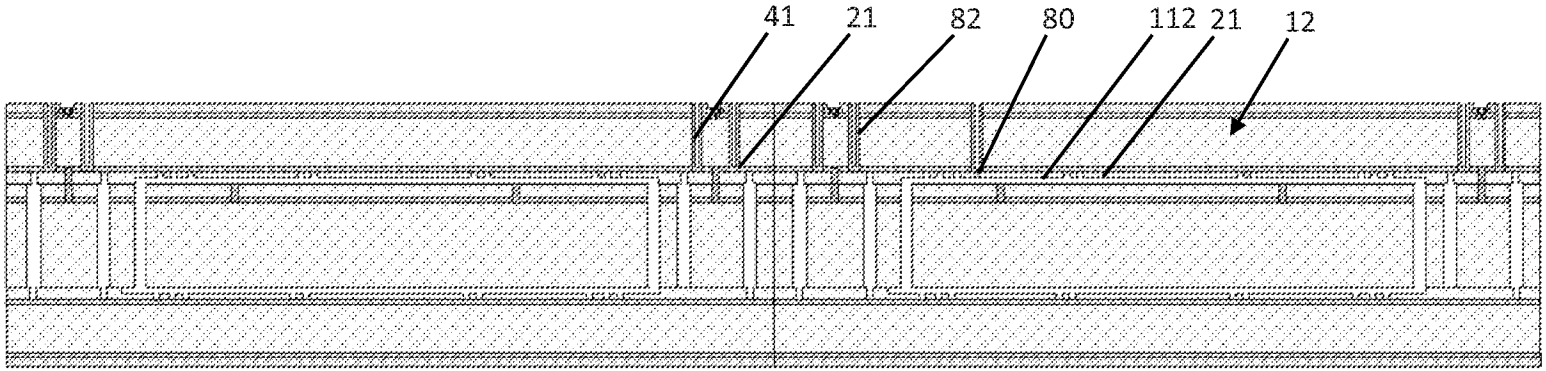
FIG. 11D is a cross-sectional view of a completed 3D MEMS two-chamber device obtained in a case where, in order to protect the second chamber from outside moisture, an oxide plug is provided in the vent hole.

Referring to FIG. 11D, to protect the second chamber 112 from outside moisture, before the photoresist is stripped, an additional layer of oxide 82 can be deposited to fill and seal the hole 80 in the SCS layer 21 and at the same time passivate the exposed SCS layer 21 and trenches 41 on the top cap 12. The oxide 82 can be deposited using an atmospheric oxide process (e.g. APCVD, or Atmospheric Pressure Chemical Vapor Deposition) to seal in an atmospheric pressure gas in the second chamber 112. The oxide on top of the photoresist can then be removed using a wet lift-off of the photoresist.

It will be understood that in other embodiments of the manufacturing method, the fabricated MEMS device may include more than two chambers.

Advantageously, in the different embodiments described above, providing at least one of the cap wafer as an SOI wafer provides, in addition to the electrical pathways formed therein, a hermetic vacuum seal around at least one of the MEMS structures, with no vertical leakage path. Furthermore since the etched trench surrounding each electrical feedthrough need not be filled, the corresponding cap wafer can be made thicker and, thus, be less sensitive to flexing due to external pressure. Also, the possibility of providing chambers with independently adjustable pressure conditions can be advantageous in implementations where the multiple-chamber MEMS device includes or houses different types of MEMS structures that are preferably operated under different pressure conditions.

The scope of the claims should not be limited by the preferred embodiments set forth in the examples, but should be given the broadest interpretation consistent with the description as a whole.

The invention claimed is:

1. A three dimensional (3D) micro-electro-mechanical system (MEMS) device comprising:

a MEMS wafer including a MEMS structure, the MEMS wafer having opposed first and second sides;

a top cap wafer and a bottom cap wafer respectively bonded to the first side and the second side of the MEMS wafer, the top cap wafer, the bottom cap wafer and the MEMS wafer being stacked along a stacking axis [and together forming] *to form* at least one hermetic cavity enclosing the MEMS structure, at least one of the top cap wafer and the bottom cap wafer being a silicon-on-insulator (SOI) cap wafer comprising a cap device layer, a *conductive silicon* cap handle layer and a cap insulating layer interposed between the cap device layer and the *conductive silicon* cap handle layer, one of the *conductive silicon* cap handle layer and [of] the cap device layer *of the SOI cap wafer* having an inner side bonded to the MEMS wafer, and [the other one of the cap handle layer and the cap device layer] *the conductive silicon cap handle layer* having an outer side with outer electrical contacts form thereon; and an electrically conductive path extending through the *conductive silicon* cap handle layer and through the cap device layer of the SOI cap wafer and comprising a conducting shunt formed through the cap insulating layer, the electrically conductive path establishing an electrical connection between one of the outer electrical contacts and said [at least one of] MEMS structure [and connecting] *wherein the conducting shunt electrically connects* the *conductive silicon* cap handle layer and the cap device layer *to conduct signals through the conduction shunt and at least a portion of the conductive silicon cap handle layer.*

2. The 3D MEMS device of claim 1, wherein said electrically conductive path comprises a post formed in the cap handle layer, the post being delineated by a closed-loop trench patterned through an entire thickness of the cap handle layer, said one of the outer electrical contacts being located on top of said post.

3. The 3D MEMS device of claim 2, wherein said electrically conductive path comprises a pad formed in the cap device layer, the pad being delineated by a trench patterned through an entire thickness of the cap device layer, the pad being aligned along the stacking axis with said post.

4. The 3D MEMS device according to claim 1, wherein the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer.

5. The 3D MEMS device of claim 4, wherein said electrically conductive path comprises a pad formed in the MEMS device layer, delineated by a trench, the pad being electrically connected to the MEMS structure, the pad formed in the MEMS device layer being aligned along the stacking axis with [a] *the* pad formed in the cap device layer.

6. The 3D MEMS device of claim [5] *1*, wherein the MEMS wafer comprises an outer frame, the MEMS structure comprising at least one proof mass suspended by springs, the at least one proof mass being patterned in both the MEMS handle and device layers, the springs being patterned in the MEMS device layer, the at least one proof mass including conductive shunts electrically connecting the MEMS device and handle layers, the electrically conductive path connecting said one of the *outer* electrical contacts to the MEMS structure via at least one of the springs.

7. The 3D MEMS device according to claim 1, wherein the cap device layer comprises *a plurality of cap* electrodes patterned therein, the 3D MEMS device comprising additional electrically conducting paths extending through the *conductive* cap handle layer and the cap device layer, at least one of said additional electrically conducting paths establishing an electrical connection between a subset of the *outer* electrical contacts and *at least a portion of* said *plurality of* cap electrodes.

8. The 3D MEMS device of claim 7, wherein the cap device layer comprises leads patterned therein, the leads being electrically connected to the cap electrodes, the leads extending orthogonally to the stacking axis and forming part of corresponding ones of said additional electrically conducting paths.

9. The 3D MEMS device according to claim 1, comprising a device feedthrough extending along the stacking axis, the device feedthrough comprising a cap feedthrough and a MEMS feedthrough aligned with one another, wherein the cap feedthrough comprises:

a cap feedthrough post patterned through the entire thickness of the cap handle layer, the cap feedthrough post being electrically connected to one of the outer electrical contacts;

a cap feedthrough pad patterned through the entire thickness of the cap device layer; and a conductive shunt formed through the cap insulating layer, electrically connecting the cap feedthrough post and the cap feedthrough pad;

wherein the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer, the MEMS feedthrough comprising:

a MEMS feedthrough post patterned through an entire thickness of the MEMS handle layer;

a MEMS feedthrough pad patterned through an entire thickness of the MEMS device layer; and a conductive shunt formed through the MEMS insulating layer, electrically connecting the MEMS feedthrough post and the MEMS feedthrough pad, thereby establishing an electrical connection between said one of the outer electrical contacts on top of the cap feedthrough post and the MEMS feedthrough, through the cap feedthrough.

10. The 3D MEMS device of claim 9, wherein trenches [delineating posts] in at least one of the SOI cap wafer and the SOI MEMS wafer are [left] unfilled.

11. The 3D MEMS device of claim 9, wherein the cap feedthrough post and the MEMS feedthrough post have respective cross-sections taken orthogonally with respect to the stacking axis, said cross-sections being of different sizes.

12. The 3D MEMS device of claim 9, wherein the device feedthrough comprises [a] *one or more* bond [pad] *pads* on the outer side of the SOI cap wafer, *the bond pads being* electrically connected to said cap feedthrough post *and configured to bond with an integrated circuit chip that receives electrical signals from the 3D MEMS device.*

13. The 3D MEMS device according to claim 9, wherein both the top and the bottom cap wafers are SOI wafers.

14. The 3D MEMS device of claim 13, wherein the cap feedthrough is a top cap feedthrough formed in the top cap wafer, and the bottom cap wafer comprises a bottom cap feedthrough aligned and electrically connected to the top cap feedthrough via the MEMS feedthrough.

15. The 3D MEMS device of claim [13] *7*, wherein the cap electrodes comprise top cap electrodes formed in the device layer of the top cap wafer, and bottom cap electrodes formed in the device layer of the bottom cap wafer.

16. The 3D MEMS device according to claim 1, wherein the cap device layer is a single crystal silicon layer.

17. The 3D MEMS device according to claim 1, wherein the cap handle layer has a thickness between 100 micrometers and 800 micrometers.

18. The 3D MEMS device according to claim 1, wherein the hermetic cavity enclosing the MEMS structure is a first cavity and wherein the MEMS structure is a first MEMS structure, the 3D MEMS device comprising at least a second cavity enclosing at least a second MEMS structure, said first and second cavities having different internal pressures.

19. The 3D MEMS device of claim 18, further comprising a vent extending through one of the top and bottom cap wafers, the vent defining a gas communication path between the second cavity and an exterior of the MEMS device.

20. The 3D MEMS device of claim 18, wherein the first cavity is a hermetically sealed vacuum cavity.

*21. A micro-electro-mechanical system (MEMS) device comprising:*

*a silicon-on-insulator (SOI) MEMS wafer including an SOI MEMS structure, the SOI MEMS wafer including a MEMS device layer, a MEMS handle layer and a MEMS insulating layer interposed between the MEMS device layer and the MEMS handle layer and having opposed first and second sides;*

*a top cap wafer and a bottom cap wafer respectively bonded relative to the first side and the second side of the SOI MEMS wafer, respectively, the SOI MEMS structure being positioned in a cavity between the top cap wafer and the bottom cap wafer such that the SOI MEMS structure moves within the cavity, at least one of the top cap wafer and the bottom cap wafer being a silicon-on-insulator (SOI) cap wafer comprising a cap device layer, a conductive cap handle layer and a cap insulating layer interposed between the cap device layer and the conductive cap handle layer, and wherein the conductive cap handle layer has an outer side with outer electrical contacts, and the cap device layer includes at least one sensing electrode connected to at least one of the outer electrical contacts; and*

*an electrically conductive path extending through an insulated feedthrough of the conductive cap handle layer, through the cap insulating layer and through the cap device layer of the SOI cap wafer, the electrically conductive path establishing an electrical connection between at least one of the outer electrical contacts and said MEMS structure that includes at least a portion of the MEMS device layer and the conductive cap handle layer.*

*22. The MEMS device of claim 21, wherein said electrically conductive path comprises the insulated feedthrough with a post formed in the cap handle layer, the post being delineated by a closed-loop trench patterned through an entire thickness of the conductive cap handle layer wherein the electrically conductive pathway is insulated, said one of the outer electrical contacts being located on top of said post, and wherein said electrically conductive path comprises a pad formed in the cap device layer, the pad being delineated by a trench patterned through an entire thickness of the cap device layer, the pad being aligned along a wafer stacking axis with said post.*

*23. The MEMS device of claim 21, wherein the SOI MEMS wafer comprises a MEMS device layer bonded to the top cap wafer, a MEMS handle layer bonded to the bottom cap wafer, and a MEMS insulating layer interposed between the MEMS device layer and the MEMS handle layer, wherein said electrically conductive path comprises a pad formed in the MEMS device layer, delineated by a trench, the pad being electrically connected to the MEMS structure, the pad formed in the MEMS device layer being aligned along the stacking axis with the pad formed in the cap device layer and wherein the SOI MEMS wafer comprises an outer frame, the MEMS structure comprising at least one proof mass suspended by springs, the at least one proof mass being patterned in both the MEMS handle and device layers, the springs being patterned in the MEMS device layer, the at least one proof mass including conductive shunts electrically connecting the MEMS device and handle layers, the electrically conductive path connecting said one of the outer electrical contacts to the MEMS structure via at least one of the springs.*

*24. The MEMS device according to claim 21, wherein the cap device layer comprises a plurality of cap electrodes patterned therein, the MEMS device comprising additional electrically conducting paths extending through the conductive cap handle layer and the cap device layer, at least one of said additional electrically conducting paths establishing an electrical connection between a subset of the electrical contacts and at least a portion of said plurality of cap electrodes and wherein the cap device layer comprises leads patterned therein, the leads being electrically connected to the cap electrodes, the leads extending orthogonally to the stacking axis and forming part of corresponding ones of said additional electrically conducting paths.*

*25. The MEMS device according to claim 21, comprising a device feedthrough extending along a stacking axis, the device feedthrough comprising the insulated feedthrough and a MEMS feedthrough aligned with one another, wherein the insulated feedthrough comprises:*

*a cap feedthrough post patterned through an entire thickness of the conductive cap handle layer, the cap feedthrough post being electrically connected to one of the outer electrical contacts;*

*a cap feedthrough pad patterned through the entire thickness of the cap device layer; and*

*a conductive shunt formed through the cap insulating layer, electrically connecting the cap feedthrough post and the cap feedthrough pad;*

*wherein SOI MEMS wafer comprises a MEMS device layer bonded to the top cap wafer, a MEMS handle layer bonded to the bottom cap wafer, and a MEMS insulating layer interposed between the MEMS device layer and the MEMS handle layer, the MEMS feedthrough comprising:*

*a MEMS feedthrough post patterned through an entire thickness of the MEMS handle layer;*

*a MEMS feedthrough pad patterned through an entire thickness of the MEMS device layer;*

*a conductive shunt formed through the MEMS insulating layer, electrically connecting the MEMS feedthrough post and the MEMS feedthrough pad, thereby establishing an electrical connection between said one of the outer electrical contacts on top of the cap feedthrough post and the MEMS feedthrough, through the cap feedthrough;*

*wherein trenches in at least one of the SOI cap wafer and the SOI MEMS wafer are unfilled;*

*wherein the cap feedthrough post and the MEMS feedthrough post have respective cross-sections taken orthogonally with respect to the stacking axis, said cross-sections being of different sizes;*

*wherein the device feedthrough comprises a bond pad on the outer side of the SOI cap wafer, the bond pad being electrically connected to said cap feedthrough post; and*

*wherein the cap feedthrough is a top cap feedthrough formed in the top cap wafer, and the bottom cap wafer comprises a bottom cap feedthrough aligned and electrically connected to the top cap feedthrough via the MEMS feedthrough.*

*26. The MEMS device of claim 21, wherein both the top and the bottom cap wafers are SOI wafers, one of the conductive cap handle layer and the cap device layer having an inner side bonded to the SOI MEMS wafer, the MEMS device being connected to an integrated circuit of an inertial measurement unit and wherein the cap electrodes comprise top cap electrodes formed in the device layer of the top cap wafer, and bottom cap electrodes formed in the device layer of the bottom cap wafer.*

*27. The MEMS device of claim 21, wherein the conductive silicon cap device layer is a single crystal silicon layer and wherein the conductive silicon cap handle layer has a thickness between 100 micrometers and 800 micrometers.*

*28. The MEMS device of claim 21, wherein the hermetic cavity enclosing the MEMS structure is a first cavity and wherein the MEMS structure is a first MEMS structure, the MEMS device comprising at least a second cavity enclosing at least a second MEMS structure, said first and second cavities having different internal pressures and further comprising a vent extending through at least one of the top and bottom cap wafers, the vent defining a gas communication path between the second cavity and an exterior of the MEMS device.*

*29. A micro-electro-mechanical system (MEMS) device comprising:*

*a MEMS wafer including a MEMS structure, the MEMS wafer having opposed first and second sides;*

*a top cap wafer and a bottom cap wafer respectively bonded to the first side and the second side of the MEMS wafer, the top cap wafer, the bottom cap wafer and the MEMS wafer being stacked along a stacking axis to form at least one hermetic cavity enclosing the MEMS structure, at least one of the top cap wafer and the bottom cap wafer being a silicon-on-insulator (SOI) cap wafer comprising a conductive silicon cap handle layer, a conductive silicon cap device layer and a cap insulating layer interposed between the cap device layer and the cap handle layer, the SOI cap wafer having a plurality of outer electrical contacts, the cap device layer including at least one sensor electrode to sense a motion of the MEMS structure and at least one drive electrode to actuate motion of the MEMS structure; and*

*an electrically conductive path extending within an insulated feedthrough of the conductive silicon cap handle layer, through the cap insulating layer, and within the conductive silicon cap device layer of the SOI cap wafer, the electrically conductive path establishing an electrical connection between at least one of the plurality of the outer electrical contacts and said MEMS structure.*

*30. The MEMS device of claim 29, wherein said electrically conductive path comprises the feedthrough with a post formed in the cap handle layer, the post being delineated by a closed-loop trench patterned through an entire thickness of the conductive silicon cap handle layer, said outer electrical contact being located on top of said post and wherein said electrically conductive path conducts electrical signals with the post and further comprises a pad formed in the conductive silicon cap device layer, the pad being delineated by a trench patterned through an entire thickness of the conductive silicon cap device layer, the pad being aligned along a wafer stacking axis with the post.*

*31. The MEMS device of claim 29, wherein the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer and wherein said electrically conductive path comprises a pad formed in the MEMS device layer, delineated by a trench, the pad being electrically connected to the MEMS structure, the pad formed in the MEMS device layer being aligned along the stacking axis with the pad formed in the cap device layer.*

*32. The MEMS device of claim 29, wherein the MEMS wafer comprises an outer frame, the MEMS structure comprising at least one proof mass suspended by springs, the at least one proof mass being patterned in both the MEMS handle and device layers, the springs being patterned in the MEMS device layer, the at least one proof mass including conductive shunts electrically connecting the MEMS device and handle layers, the electrically conductive path connecting said outer electrical contact to the MEMS structure via at least one of the springs.*

*33. The MEMS device of claim 29, wherein the conductive silicon cap device layer comprises a plurality of cap electrodes patterned therein, the MEMS device comprising additional electrically conducting paths extending through the conductive silicon cap handle layer and the conductive silicon cap device layer, at least one of said additional electrically conducting paths establishing an electrical connection between the outer electrical contact and at least a portion of said plurality of cap electrodes and wherein the conductive silicon cap device layer comprises leads patterned therein, the leads being electrically connected to the cap electrodes, the leads extending orthogonally to the stacking axis and forming part of corresponding ones of said additional electrically conducting paths.*

*34. The MEMS device according to claim 29, comprising a device feedthrough extends along a wafer stacking axis, the device feedthrough comprising the insulated feedthrough and a MEMS feedthrough aligned with the insulated feedthrough that comprises:*

*a cap feedthrough post patterned through an entire thickness of the cap handle layer, the cap feedthrough post being electrically connected to one of the outer electrical contacts;*

*a cap feedthrough pad patterned through the entire thickness of the cap device layer; and*

*a conductive shunt formed through the cap insulating layer, electrically connecting the cap feedthrough post and the cap feedthrough pad;*

*wherein the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer, the MEMS feedthrough comprising:*

*a MEMS feedthrough post patterned through an entire thickness of the MEMS handle layer;*

*a MEMS feedthrough pad patterned through an entire thickness of the MEMS device layer;*

*a conductive shunt formed through the MEMS insulating layer, electrically connecting the MEMS feedthrough post and the MEMS feedthrough pad, thereby establishing an electrical connection between said one of the outer electrical contacts on top of the cap feedthrough post and the MEMS feedthrough, through the cap feedthrough;*

*wherein trenches in at least one of the SOI cap wafer and the SOI MEMS wafer are unfilled;*

*wherein the cap feedthrough post and the MEMS feedthrough post have respective cross-sections taken orthogonally with respect to the stacking axis, said cross-sections being of different sizes; and*

*wherein the device feedthrough comprises a bond pad on the outer side of the SOI cap wafer, the bond pad being electrically connected to said cap feedthrough post.*

*35. The MEMS device of claim 29, wherein one of the cap handle layer and the cap device layer has an inner side bonded to the MEMS wafer, and the other one of the cap handle layer and the cap device layer has an outer side bonded to the MEMS wafer, the MEMS device being connected to an integrated circuit of an inertial measurement unit.*

*36. The MEMS device of claim 29, wherein the top cap wafer and the bottom cap wafer comprise SOI cap wafers and further comprising cap electrodes including top cap electrodes formed in a device layer of the top cap wafer, and bottom cap electrodes formed in a device layer of the bottom cap wafer.*

*37. The MEMS device of claim 29, wherein the cap device layer is a single crystal silicon layer and wherein the cap handle layer has a thickness between 100 micrometers and 800 micrometers.*

*38. The MEMS device of claim 29, wherein the cavity enclosing the MEMS structure is a first cavity and wherein the MEMS structure is a first MEMS structure, the MEMS device comprising at least a second cavity enclosing at least a second MEMS structure, said first and second cavities having different internal pressures and further comprising a vent extending through one of the top and bottom cap wafers, the vent defining a gas communication path between the second cavity and an exterior of the MEMS device.*

*39. A micro-electro-mechanical system (MEMS) device comprising:*

*a MEMS wafer including a MEMS structure, the MEMS wafer having opposed first and second sides;*

*a top cap wafer and a bottom cap wafer respectively bonded relative to the first side and the second side of the MEMS wafer to form a wafer stack, at least the top cap wafer, the bottom cap wafer and the MEMS wafer being stacked to form at least one cavity wherein the MEMS structure is within the cavity, the top cap wafer and the bottom cap wafer respectively being first and second silicon-on-insulator (SOI) cap wafers, each SOI cap wafer comprising a conductive silicon cap device layer, a conductive silicon cap handle layer and a cap insulating layer interposed between the conductive silicon cap device layer and the conductive silicon cap handle layer; and*

*an electrically conductive path extending through an insulated feedthrough of the conductive silicon cap handle layer, through the cap insulating wafer, and through the conductive silicon cap device layer of the top SOI cap wafer and through at least a portion of the MEMS wafer to electrically contact the cap device layer of the bottom SOI cap wafer, the electrically conductive path establishing an electrical connection between a first outer electrical contact and the bottom cap device layer and a further electrically conductive path establishing an electrical connection between a second outer electrical contact and said MEMS structure.*

*40. The MEMS device of claim 39, wherein said insulated feedthrough comprises a post formed in the conductive silicon cap handle layer, the post being delineated by a closed-loop trench patterned through an entire thickness of the conductive silicon cap handle layer, said outer electrical contact being located on top of said post and wherein said electrically conductive path includes a single crystal silicon material and a polysilicon material and further comprises a pad formed in the conductive silicon cap device layer, the pad being delineated by a trench patterned through an entire thickness of the conductive silicon cap device layer, the pad being aligned along a wafer stacking axis with said post.*

*41. The MEMS device of claim 39, wherein the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer.*

*42. The MEMS device of claim 41, wherein said electrically conductive path comprises a pad formed in the MEMS device layer, delineated by a trench, the pad being electrically connected to the MEMS structure, the pad formed in the MEMS device layer being aligned along the stacking axis with the pad formed in the cap device layer.*

*43. The MEMS device of claim 39, wherein the MEMS wafer comprises an outer frame, the MEMS structure comprising at least one proof mass suspended by a spring and wherein the at least one proof mass being patterned in MEMS handle and device layers of an SOI MEMS wafer, the spring being patterned in the MEMS device layer, the at least one proof mass including conductive shunts electrically connecting the MEMS device and handle layers, the electrically conductive path connecting said outer electrical contact to the MEMS structure via at least one of the springs.*

*44. The MEMS device of claim 39, wherein each cap device layer comprises a plurality of cap electrodes patterned therein, the MEMS device comprising additional electrically conducting paths extending through the cap handle layer and the cap device layer, at least one of said additional electrically conducting paths establishing an electrical connection between the outer electrical contact and at least a portion of a plurality of cap electrodes and wherein the cap device layer comprises leads patterned therein, the leads being electrically connected to the cap electrodes, the leads extending orthogonally to a stacking axis and forming part of corresponding ones of said additional electrically conducting paths.*

*45. The MEMS device according to claim 39, comprising a device feedthrough extends along a stacking axis, the device feedthrough comprising the insulated feedthrough and a MEMS feedthrough aligned with the insulated feedthrough that comprises:*

*a cap feedthrough post patterned through an entire thickness of the cap handle layer, the cap feedthrough post being electrically connected to the outer electrical contact;*

*a cap feedthrough pad patterned through the entire thickness of the cap device layer; and*

*a conductive shunt formed through the cap insulating layer, electrically connecting the cap feedthrough post and the cap feedthrough pad;*

*wherein the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer, the MEMS feedthrough comprising:*

*a MEMS feedthrough post patterned through an entire thickness of the MEMS handle layer;*

*a MEMS feedthrough pad patterned through an entire thickness of the MEMS device layer;*

*a conductive shunt formed through the MEMS insulating layer, electrically connecting the MEMS feedthrough post and the MEMS feedthrough pad, thereby establishing an electrical connection between said outer electrical contact on top of the cap feedthrough post and the MEMS feedthrough, through the cap feedthrough;*

*wherein trenches in at least one of the SOI cap wafer and the SOI MEMS wafer are unfilled;*

*wherein the cap feedthrough post and the MEMS feedthrough post have respective cross-sections taken orthogonally with respect to the stacking axis, said cross-sections being of different sizes and*

*wherein the device feedthrough comprises a bond pad on the outer side of the SOI cap wafer, the bond pad being electrically connected to said cap feedthrough post.*

*46. The MEMS device of claim 39, wherein one of the cap handle layer and the cap device layer has an inner side bonded to the MEMS wafer, and the other one of the cap handle layer and the cap device layer has an outer side bonded to the MEMS wafer, the MEMS device being connected to an integrated circuit of an inertial measurement unit.*

*47. The MEMS device of claim 46, wherein the cap feedthrough is a top cap feedthrough formed in the top cap wafer, and the bottom cap wafer comprises a bottom cap feedthrough aligned and electrically connected to the top cap feedthrough via the MEMS feedthrough and wherein the cap electrodes comprise top cap electrodes formed in the device layer of the top cap wafer, and bottom cap electrodes formed in the device layer of the bottom cap wafer.*

*48. The MEMS device of claim 39, wherein the conductive silicon cap device layer is a single crystal silicon layer and wherein the conductive silicon cap handle layer has a thickness between 100 micrometers and 800 micrometers.*

*49. The MEMS device of claim 39, wherein the cavity for the MEMS structure is a first hermetically sealed cavity and wherein the MEMS structure is a first MEMS structure, the MEMS device comprising at least a second cavity enclosing at least a second MEMS structure, said first and second cavities having different internal pressures and further comprising a vent extending through one of the top and bottom cap wafers, the vent defining a gas communication path between the second cavity and an exterior of the MEMS device.*

*50. A micro-electro-mechanical system (MEMS) device comprising:*

*a MEMS wafer including a MEMS structure, the MEMS wafer having opposed first and second sides;*

*a top cap wafer and a bottom cap wafer respectively bonded on the first side and the second side of the MEMS wafer, respectively, the top cap wafer, the bottom cap wafer and the MEMS wafer being stacked along a stacking axis to form at least one hermetic cavity that houses the MEMS structure, at least one of the top cap wafer and the bottom cap wafer being a silicon-on- insulator (SOI) cap wafer comprising a conductive silicon cap handle layer, a conductive silicon cap device layer and a cap insulating layer interposed between the conductive silicon cap device layer and the conductive silicon cap handle layer, the SOI cap wafer having a plurality of outer electrical contacts, the conductive silicon cap device layer including at least one sensor electrode to sense a motion of the MEMS structure and at least one drive electrode to actuate motion of the MEMS structure; and*

*an electrically conductive path extending within an insulated feedthrough of the conductive silicon cap handle layer, through the cap insulating layer, and within the conductive silicon cap device layer of the SOI cap wafer, the insulated feedthrough defined by a trench extending through an entire thickness of the conductive silicon cap handle layer that provides an electrical connection between at least one of the plurality of the outer electrical contacts and said MEMS structure.*

*51. The MEMS device of claim 50, wherein said insulated feedthrough comprises a post formed in the conductive silicon cap handle layer, the post being delineated by the trench formed as a closed-loop trench patterned through an entire thickness of the conductive silicon cap handle layer, said outer electrical contact being located on top of said post and wherein said electrically conductive path comprises a pad formed in the conductive silicon cap device layer, the pad being aligned along a wafer stacking axis with the post.*

*52. The MEMS device of claim 50, wherein the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer.*

*53. The MEMS device of claim 50, wherein the MEMS wafer comprises a frame, the MEMS structure comprising at least one proof mass suspended one or more springs, the at least one proof mass being patterned in both the MEMS handle and device layers, the one or more springs being patterned in the MEMS device layer, the at least one proof mass including conductive shunts electrically connecting the MEMS device and handle layers, the electrically conductive path connecting said outer electrical contact to the MEMS structure via the at least one spring.*

*54. The MEMS device of claim 50, wherein the cap device layer comprises a plurality of cap electrodes patterned therein, the MEMS device comprising additional electrically conducting paths extending through the conductive silicon cap handle layer and the conductive silicon cap device layer, at least one of said additional electrically conducting paths establishing an electrical connection between the outer electrical contact and at least a portion of said plurality of cap electrodes and wherein the conductive silicon cap device layer comprises leads patterned therein, the leads being electrically connected to the cap electrodes, the leads extending orthogonally to the stacking axis and forming part of corresponding ones of said additional electrically conducting paths.*

*55. The MEMS device according to claim 50, comprising a device feedthrough extending along a wafer stacking axis, the device feedthrough comprising the insulated feedthrough*

*and a MEMS feedthrough aligned with one another, wherein the insulated feedthrough comprises:*

*a cap feedthrough post patterned through an entire thickness of the cap handle layer, the cap feedthrough post being electrically connected to one of the outer electrical contacts;*

*a cap feedthrough pad patterned through the entire thickness of the cap device layer; and*

*a conductive shunt formed through the cap insulating layer, electrically connecting the cap feedthrough post and the cap feedthrough pad;*

*wherein the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer, the MEMS feedthrough comprising:*

*a MEMS feedthrough post patterned through an entire thickness of the MEMS handle layer;*

*a MEMS feedthrough pad patterned through an entire thickness of the MEMS device layer;*

*a conductive shunt formed through the MEMS insulating layer, electrically connecting the MEMS feedthrough post and the MEMS feedthrough pad, thereby establishing an electrical connection between said one of the outer electrical contacts on top of the cap feedthrough post and the MEMS feedthrough, through the cap feedthrough;*

*wherein trenches in at least one of the SOI cap wafer and the SOI MEMS wafer are unfilled;*

*wherein the cap feedthrough post and the MEMS feedthrough post have respective cross-sections taken orthogonally with respect to the stacking axis, said cross-sections being of different sizes and*

*wherein the device feedthrough comprises a bond pad on the outer side of the SOI cap wafer, the bond pad being electrically connected to said cap feedthrough post.*

*56. The MEMS device of claim 50, wherein one of the cap handle layer and the cap device layer has an inner side bonded to the MEMS wafer, and the other one of the cap handle layer and the cap device layer has an outer side bonded to the MEMS wafer, the MEMS device being connected to an integrated circuit of an inertial measurement unit.*

*57. The MEMS device of claim 50, wherein the top cap wafer and the bottom cap wafer comprise SOI cap wafers and further comprising cap electrodes including top cap electrodes formed in a device layer of the top cap wafer, and bottom cap electrodes formed in a device layer of the bottom cap wafer.*

*58. The MEMS device of claim 50, wherein the conductive silicon cap device layer is a single crystal silicon layer and wherein the conductive silicon cap handle layer has a thickness between 100 micrometers and 800 micrometers.*

*59. The MEMS device of claim 50, wherein the cavity enclosing the MEMS structure is a first cavity and wherein the MEMS structure is a first MEMS structure, the MEMS device comprising at least a second cavity enclosing at least a second MEMS structure, said first and second cavities having different internal pressures and further comprising a vent extending through one of the top and bottom cap wafers, the vent defining a gas communication path between the second cavity and an exterior of the MEMS device.*

*60. A micro-electro-mechanical system (MEMS) device comprising:*

*a MEMS wafer including a MEMS structure, the MEMS wafer having opposed first and second sides;*

*a top cap wafer and a bottom cap wafer respectively bonded relative to the first side and the second side, respectively, of the MEMS wafer to form a wafer stack, at least the top cap wafer, the bottom cap wafer and the MEMS wafer being stacked to form at least one cavity wherein the MEMS structure is within the cavity, the top cap wafer and the bottom cap wafer, respectively, being a top silicon-on-insulator (SOI) cap wafer and a bottom SOI cap wafer, the top SOI cap wafer and the bottom SOI cap wafer each comprising a conductive silicon cap device layer, a conductive silicon cap handle layer and a cap insulating layer interposed between the conductive silicon cap device layer and the conductive silicon cap handle layer; and*

*a first insulated electrically conductive path extending through an insulated feedthrough of the conductive silicon cap handle layer, through the cap insulating wafer, and through the conductive silicon cap device layer of the top SOI cap wafer and through at least a portion of the MEMS wafer to electrically contact the conductive silicon cap device layer of the bottom SOI cap wafer, the electrically conductive path establishing an electrical connection between a first outer electrical contact and the bottom cap device layer and a second electrically conductive path establishing an electrical connection between a second outer electrical contact and said MEMS structure.*

*61. The MEMS device of claim 60, wherein said insulated feedthrough comprises a post formed in the cap handle layer, the post being delineated by a closed-loop trench patterned through an entire thickness of the cap handle layer, said outer electrical contact being located on top of said post and wherein said electrically conductive path comprises a pad formed in the cap device layer, the pad being delineated by a trench patterned through an entire thickness of the cap device layer, the pad being aligned along a wafer stacking axis with said post.*

*62. The MEMS device of claim 60, wherein the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer.*

*63. The MEMS device of claim 60, wherein said electrically conductive path comprises a pad formed in the MEMS device layer, delineated by a trench, the pad being electrically connected to the MEMS structure, the pad formed in the MEMS device layer being aligned along the stacking axis with the pad formed in the conductive silicon cap device layer.*

*64. The MEMS device of claim 60, wherein the MEMS wafer comprises an outer frame, the MEMS structure comprising at least one proof mass suspended by a spring and wherein the at least one proof mass being patterned in MEMS handle and device layers of an SOI MEMS wafer, the spring being patterned in the MEMS device layer, the at least one proof mass including conductive shunts electrically connecting the MEMS device and handle layers, the electrically conductive path connecting said outer electrical contact to the MEMS structure via at least one of the springs.*

*65. The MEMS device of claim 60, wherein each conductive silicon cap device layer comprises a plurality of cap electrodes patterned therein, the MEMS device comprising additional electrically conducting paths extending through the conductive silicon cap handle layer and the conductive silicon cap device layer, at least one of said additional*

*electrically conducting paths establishing an electrical connection between the outer electrical contact and at least a portion of a plurality of cap electrodes and wherein the conductive silicon cap device layer comprises leads patterned therein, the leads being electrically connected to the cap electrodes, the leads extending orthogonally to a stacking axis and forming part of corresponding ones of said additional electrically conducting paths.*

*66. The MEMS device according to claim 60, comprising a device feedthrough extending along a stacking axis, the device feedthrough comprising the insulated feedthrough and a MEMS feedthrough aligned with one another, wherein the insulated feedthrough comprises:*

*a cap feedthrough post patterned through an entire thickness of the cap handle layer, the cap feedthrough post being electrically connected to the outer electrical contact;*

*a cap feedthrough pad patterned through the entire thickness of the cap device layer; and*

*a conductive shunt formed through the cap insulating layer, electrically connecting the cap feedthrough post and the cap feedthrough pad;*

*wherein the MEMS wafer is an SOI MEMS wafer comprising a MEMS device layer bonded to the top cap wafer, a MEMS handle layer bonded to the bottom cap wafer, and a MEMS insulating layer interposed between the MEMS device layer and the MEMS handle layer, the MEMS feedthrough comprising:*

*a MEMS feedthrough post patterned through an entire thickness of the MEMS handle layer;*

*a MEMS feedthrough pad patterned through an entire thickness of the MEMS device layer;*

*a conductive shunt formed through the MEMS insulating layer, electrically connecting the MEMS feedthrough post and the MEMS feedthrough pad, thereby establishing an electrical connection between said outer electrical contact on top of the cap feedthrough post and the MEMS feedthrough, through the cap feedthrough;*

*wherein trenches in at least one of the SOI cap wafer and the SOI MEMS wafer are unfilled;*

*wherein the cap feedthrough post and the MEMS feedthrough post have respective cross-sections taken orthogonally with respect to the stacking axis, said cross-sections being of different sizes; and*

*wherein the device feedthrough comprises a bond pad on the outer side of the SOI cap wafer, the bond pad being electrically connected to said cap feedthrough post.*

*67. The MEMS device of claim 60, wherein one of the conductive silicon cap handle layer and the conductive silicon cap device layer has an inner side bonded to the MEMS wafer, and the other one of the conductive silicon cap handle layers and the conductive silicon cap device layer has an outer side bonded to the MEMS wafer, the MEMS device being connected to an integrated circuit of an inertial measurement unit.*

*68. The MEMS device of claim 66, wherein the insulated feedthrough is a top cap feedthrough formed in the top cap wafer, and the bottom cap wafer comprises a bottom cap feedthrough aligned and electrically connected to the top cap feedthrough via the MEMS feedthrough and wherein the cap electrodes comprise top cap electrodes formed in the conductive silicon device layer of the top cap wafer, and bottom cap electrodes formed in the conductive silicon device layer of the bottom cap wafer.*

*69. The MEMS device of claim 60, wherein the conductive silicon cap device layer is a single crystal silicon layer and wherein the conductive silicon cap handle layer has a thickness between 100 micrometers and 800 micrometers.*

*70. The MEMS device of claim 60, wherein the cavity for the MEMS structure is a first hermetically sealed cavity and wherein the MEMS structure is a first MEMS structure, the MEMS device comprising at least a second cavity enclosing at least a second MEMS structure, said first and second cavities having different internal pressures and further comprising a vent extending through one of the top and bottom cap wafers, the vent defining a gas communication path between the second cavity and an exterior of the MEMS device.*

* * * * *